United States Patent
Wu et al.

(10) Patent No.: US 10,083,742 B2
(45) Date of Patent: Sep. 25, 2018

(54) METHOD AND APPARATUS FOR PROGRAMMING NON-VOLATILE MEMORY USING A MULTI-CELL STORAGE CELL GROUP TO PROVIDE ERROR LOCATION INFORMATION FOR RETENTION ERRORS

(71) Applicant: INTEL CORPORATION, Santa Clara, CA (US)

(72) Inventors: Wei Wu, Portland, OR (US); Jawad B. Khan, Cornelius, OR (US); Sanjeev N. Trika, Portland, OR (US); Yi Zou, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/276,588

(22) Filed: Sep. 26, 2016

(65) Prior Publication Data
US 2018/0090201 A1   Mar. 29, 2018

(51) Int. Cl.
*G11C 16/04*    (2006.01)
*G11C 11/56*    (2006.01)
(Continued)

(52) U.S. Cl.
CPC ...... *G11C 11/5628* (2013.01); *G06F 11/1044* (2013.01); *G11C 11/5642* (2013.01); *G11C 29/52* (2013.01)

(58) Field of Classification Search
CPC .............. G11C 16/26; G11C 11/5642; G11C 2211/5621; G11C 16/0483; G11C 16/24;
(Continued)

(56) References Cited

U.S. PATENT DOCUMENTS 5,754,469 A  *  5/1998  Hung ................. G11C 11/5621
                                                   365/185.03
8,248,124 B2     8/2012  Mosalikanti et al.
(Continued)

FOREIGN PATENT DOCUMENTS

KR       20110099563        9/2011

OTHER PUBLICATIONS

Cai, Y., et al., "Threshold Voltage Distribution in MLC NAND Flash Memory: Characterization, Analysis, and Modeling", Proceedings of the Conference on Design, Automation and Test in Europe 13, 2013, 6 pp.
(Continued)

*Primary Examiner* — Thong Q Le
(74) *Attorney, Agent, or Firm* — Konrad Raynes Davda & Victor LLP; David W. Victor

(57) ABSTRACT

Provided are a method and apparatus for programming non-volatile memory using a multi-cell storage cell group to provide error location information for retention errors. Each storage cell in the non-volatile memory is programmed with threshold voltage levels and each storage cell is programmed from bits from a plurality of pages. A memory controller organizes the storage cells into storage cell groups, each storing m bits of information programmed with the threshold voltage levels. A determination is made of one threshold voltage level to use for each of the storage cells in the storage cell group to program a selected k bits in the storage cell group with threshold voltage levels defining one of a plurality of valid states. The threshold voltage levels for at least one of the storage cells of the storage cell group in any two valid states differ by at least two threshold voltage levels.

27 Claims, 17 Drawing Sheets

(51) Int. Cl.
*G11C 29/52* (2006.01)
*G06F 11/10* (2006.01)

(58) Field of Classification Search
CPC ............ G11C 16/08; G11C 16/3459; G11C 2211/5624; G11C 2211/5631; G11C 2211/5632
USPC ............ 365/185.03, 185.22, 185.17, 185.25, 365/185.33, 185.12, 185.18, 185.24, 365/185.05, 185.19, 185.21, 185.29, 203
See application file for complete search history.

(56) References Cited

U.S. PATENT DOCUMENTS

| | | | |
|---|---|---|---|
| 8,482,977 B2 | 7/2013 | Kim et al. | |
| 8,533,550 B2 | 9/2013 | Khan | |
| 8,751,904 B2 | 6/2014 | Wang et al. | |
| 9,251,060 B2 | 2/2016 | Khan et al. | |
| 2004/0037144 A1 | 2/2004 | Pascucci et al. | |
| 2007/0035994 A1 | 2/2007 | Kong et al. | |
| 2009/0073762 A1 | 3/2009 | Lee et al. | |
| 2009/0290414 A1* | 11/2009 | Hosono | G11C 11/5628 365/185.03 |
| 2009/0327841 A1 | 12/2009 | Litsyn et al. | |
| 2011/0055461 A1 | 3/2011 | Steiner et al. | |
| 2011/0075478 A1* | 3/2011 | Yoon | G06F 11/1072 365/185.03 |
| 2013/0170296 A1 | 7/2013 | Yun | |
| 2013/0242653 A1 | 9/2013 | Kim | |
| 2013/0294157 A1 | 11/2013 | Sharon et al. | |
| 2013/0294159 A1 | 11/2013 | Bauer | |
| 2014/0056069 A1* | 2/2014 | Park | G11C 16/0483 365/185.05 |
| 2014/0071761 A1* | 3/2014 | Sharon | G11C 16/26 365/185.18 |
| 2016/0371028 A1* | 12/2016 | Berman | G06F 12/00 |

OTHER PUBLICATIONS

Li, J., et al., "How Much Can Data Compressibility Help to Improve NAND Flash Memory Lifetime?", Proceedings of the 13th USENIX Conference on File and Storage Technologies, Feb. 2015, 15 pp.
Yaakobi, E., et al., "Error-Correcting Codes for TLC Flash", Flash Memory Summit, Aug. 2011, 24 pp.
U.S. Appl. No. 15/228,699, entitled "Apparatus and Method for Endurance Friendly Programming Using Lower Voltage Thresholds", Invented by W. Wu et al., filed Aug. 4, 2016, 60 pp. [77.348 (Appln)].
U.S. Appl. No. 15/228,729, entitled "Apparatus and Method for Programming Non-Volatile Memory Using a Multi-Cell Storage Cell Group", Invented by W. Wu et al., filed Aug. 4, 2016, 51 pp. [77.353 (Appln)].
U.S. Pat. No. 8,482,977, dated Jul. 9, 2013, is an English language equivalent of KR Publication No. 2011-0099563, dated Sep. 8, 2011.
International Search Report and Written Opinion for International Application No. PCT/US2017/048514, dated Dec. 11, 2017, 12 pp.
Notice of Allowance 2 for U.S. Appl. No. 15/228,699, dated Mar. 26, 2018, 10 pp.
Office Action 1 for U.S. Appl. No. 15/228,729, dated Feb. 8, 2018, 31 pp.
Office Action 1 for U.S. Appl. No. 15/228,699, dated Jun. 12, 2017, 22 pp.
Response to Office Action 1 for U.S. Appl. No. 15/228,699, dated Sep. 12, 2017, 15 pp.
Notice of Allowance 1 for U.S. Appl. No. 15/228,699, dated Nov. 30, 2017, 13 pp.
International Search Report and Written Opinion for International Application No. PCT/US2017/041603, dated Oct. 18, 2017, 12 pp.
International Search Report and Written Opinion for International Application No. PCT/US2017/041606, dated Oct. 19, 2017, 13 pp.

* cited by examiner

Device Page Information

State Mapping

FIG. 5A

| Cell0\Cell1 | E | P1 | P2 | P3 |
|---|---|---|---|---|
| E | VS | VS | VS | VS |
| P1 | VS | VS | ✗VS | VS |
| P2 | VS | VS | VS | VS |
| P3 | VS | VS | VS | VS |

| Cell0\Cell1 | E | P1 | P2 | P3 |
|---|---|---|---|---|
| E | VS | IS | VS | ✗ |
| P1 | IS | VS | ✗ | VS |
| P2 | VS | IS | VS | IS |
| P3 | IS | VS | IS | VS |

| Cell0\Cell1 | E | P1 | P2 | P3 |
|---|---|---|---|---|
| E | VS | IS | IS | IS |
| P1 | ✗ | ✗ | VS | IS |
| P2 | VS | IS | IS | IS |
| P3 | IS | IS | VS | IS |

| Cell$_i$ \ Cell$_j$ | E | P1 | P2 | P3 |
|---|---|---|---|---|
| E | _, 11 | //// |  | //// |
| P1 | //// | _, 10 | //// |  |
| P2 | _, 00 | //// |  | //// |
| P3 | //// | _, 01 | //// |  |

(a) Programming LSB

FIG. 9B

| Cell$_i$ \ Cell$_j$ | E | P1 | P2 | P3 |
|---|---|---|---|---|
| E | 1, 11 | //// | → 0, 11 | //// |
| P1 | //// | 1, 10 | //// | → 0, 10 |
| P2 | 1, 00 | //// | → 0, 00 | //// |
| P3 | //// | 1, 01 | //// | → 0, 01 |

(b) Programming MSB with LSB set

LSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | P1, P1 | No Programming, No Programming |
| 100 | P2, No Programming | No Programming, No Programming |
| 101 | P3, P1 | No Programming, No Programming |
| 011 | No Programming, No Programming | No Programming, P2 |
| 000 | P2, No Programming | No Programming, P2 |
| 001 | P3, P1 | P3, P3 |
| 010 | P1, P1 | No Programming, P3 |
|  |  |  |

| Cell_i \ Cell_j | E | P1 | P2 | P3 |
|---|---|---|---|---|
| E | 1, _ | // | 0, _ | // |
| P1 | // |  | // |  |
| P2 |  | // | // | // |
| P3 | // |  | // |  |

(a) Programming MSB

FIG. 11B

| Cell_i \ Cell_j | E | P1 | P2 | P3 |
|---|---|---|---|---|
| E | 1, 11 | // | 0, 11 | // |
| P1 | // | 1, 10 | // | 0, 10 |
| P2 | 1, 00 | // | 0, 00 | // |
| P3 | // | 1, 01 | // | 0, 01 |

(b) Programming LSB with MSB set

MSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | No Programming, No Programming | P1, P1 |
| 100 | No Programming, No Programming | P2, No Programming |
| 101 | No Programming, No Programming | P3, P1 |
| 011 | No Programming, P2 | No Programming, No Programming |
| 000 | No Programming, P2 | P2, No Programming |
| 001 | No Programming, P2 | P3, P3 |
| 010 | No Programming, P2 | P1, P3 |
|  |  |  |

METHOD AND APPARATUS FOR PROGRAMMING NON-VOLATILE MEMORY USING A MULTI-CELL STORAGE CELL GROUP TO PROVIDE ERROR LOCATION INFORMATION FOR RETENTION ERRORS

TECHNICAL FIELD

Embodiments described herein generally relate to a method and apparatus for programming non-volatile memory using a multi-cell storage cell group to provide error collection information for retention errors.

BACKGROUND

Solid state storage devices (for example, solid state drives) may be comprised of one or more packages of non-volatile memory dies, where each die is comprised of storage cells, where storage cells are organized into pages and pages are organized into blocks. Each storage cell can store one or more bits of information. A multi-level cell non-volatile memory cell for example, MLC NAND representing two bits of information is programmed with four threshold voltage levels, E, P1, P2, and P3.

A retention error occurs when the stored voltage level for a cell experiences leakage and transitions or migrates to a lower threshold level, such as from P3 to P2, P2 to P1, or P1 to E. Retention errors may also occur as a result of operations that introduce a voltage shift (higher or lower), such as a read or write disturbance. Error correction code techniques identify the location of the errors by calculating a syndrome and using the syndrome along with parity information to correct errors in bits determined to have errors.

There is a need in the art for improved techniques for determining the location of the data experiencing the errors to calculate the syndrome and use with the parity information to correct retention errors.

BRIEF DESCRIPTION OF THE DRAWINGS

Embodiments are described by way of example, with reference to the accompanying drawings, which are not drawn to scale, in which like reference numerals refer to similar elements.

FIGS. 5A, 5B, and 5C illustrate embodiments of the different possible number of valid states for storage cell groups comprising two storage cells, each cell programmed with one of four threshold voltage levels.

FIGS. 9A and 9B illustrate a two-step programming of the least significant bits and then the most significant bit to a storage cell pair.

FIG. 10 illustrates a programming table of the programming steps to program a storage cell pair according to FIGS. 9A and 9B.

FIGS. 11A and 11B illustrate a two-step programming of the most significant bit and then the least significant bits to a storage cell pair.

FIG. 12 illustrates a programming table of the programming steps to program a storage cell pair according to FIGS. 11A and 11B.

DESCRIPTION OF EMBODIMENTS

Figure 1:
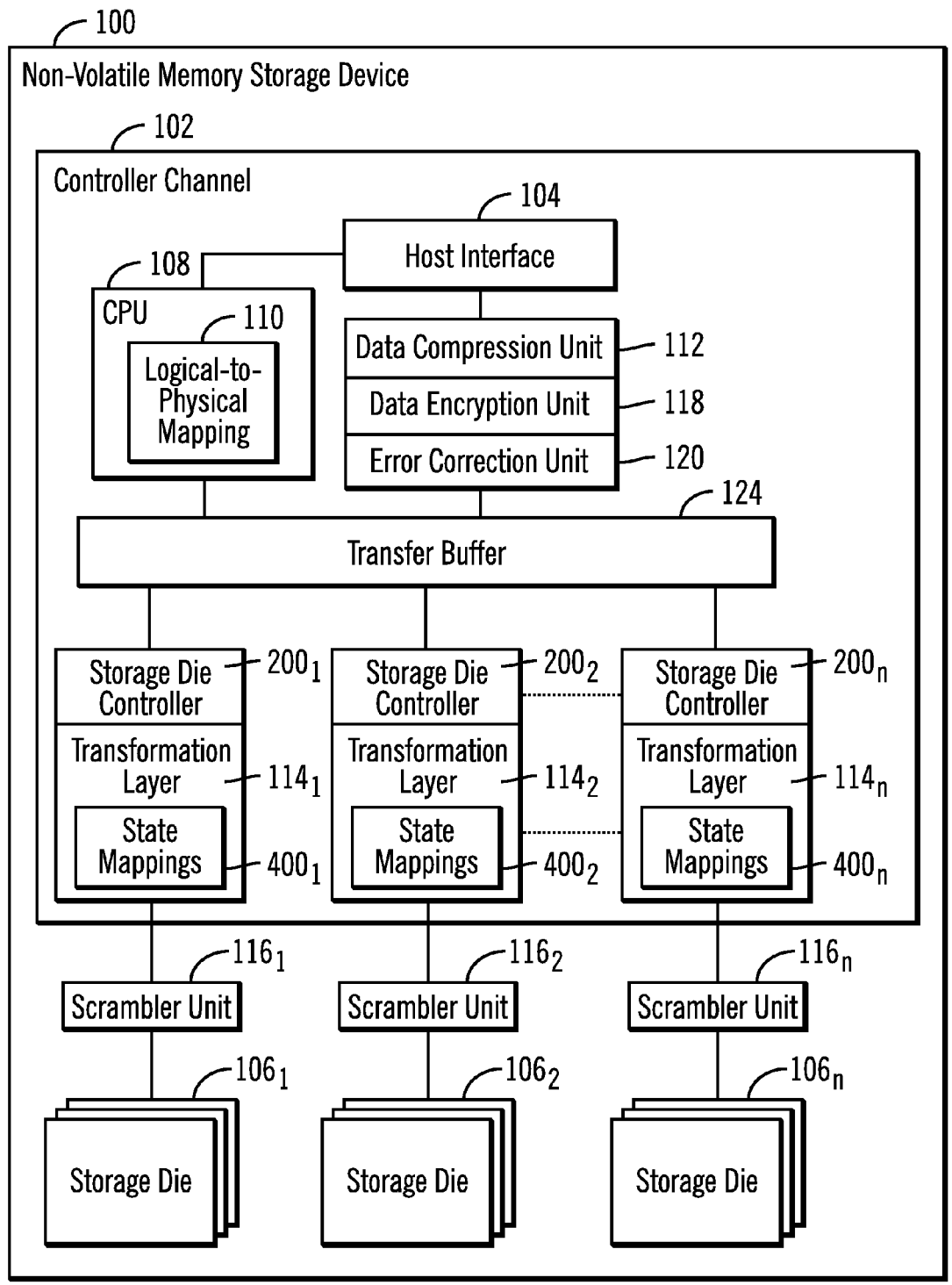
FIG. 1 illustrates an embodiment of a non-volatile memory storage device.

Described embodiments provide techniques to group storage cells in a storage cell group of multiple storage cells to provide for invalid states for the states that may be programmed for the storage cells in the storage cell group using threshold voltage levels. By grouping storage cells into storage cell groups to store bits from received pages, there may be a number valid states used to represent the received bits that is fewer than all possible states because more storage cells, as grouped in a storage cell group, are being used to store the received bits. The invalid states are defined such that the threshold voltage levels for at least one of the storage cells of the storage cell group in any two valid states differ by at least two threshold voltage levels. In this way, storage cells of the storage cell group programmed in any valid state experiencing retention errors, such as leakage of one threshold voltage level, would transition to an invalid state. When reading a storage cell group having an invalid state, those read bits can be marked as invalid to provide to the error correction unit accurate information on the location of the invalid bits for use in calculating error correction information.

By only using a portion of the storage cell states and marking the rest as invalid, valid and invalid states are interleaved, so that the 'Hamming Distance', which equals to the number of migrations from one valid state to another valid state, becomes larger. This interleaved assignment of valid states allows immediate detection of errors upon decoding bits and determining they represent an invalid state. Such detection of the location of the bits and cells experiencing the errors is known as "erasure" According to coding theory, given a same Error Correction Code (ECC) code, the number of erasures that can be corrected is twice as many as the number of errors. The in-situ error detecting capability of the described embodiments improves the effectiveness of error correcting without adding ECC bits.

The described in-situ error detection programming methodology may be provided by compressing the bits to be stored so as to allow for states that may be marked as invalid to use to detect leakage.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory storage device 100 having a controller channel 102, a host interface 104 to transfer blocks of data between a connected host system, and a plurality of groups of storage dies $106_1, 106_2 \ldots 106_n$ implementing storage cells that may be organized into pages of storage cells, where the pages are organized into blocks. The non-volatile memory storage device 100 may function as both a memory device and/or a storage device in a computing system, and may be used to perform the role of volatile memory devices and disk drives in a computing system. In an embodiment, the non-volatile memory storage device 100 may comprise a solid state drive (SSD) of NAND storage dies $106_1, 106_2 \ldots 106_n$. The controller channel 102 includes a central processing unit (CPU) 108 implementing certain control functions, such as a logical-to-physical mapping 110 provides a mapping of logical addresses to which I/O requests are directed and physical addresses in the storage dies $106_1, 106_2 \ldots 106_n$.

The controller channel 102 includes a plurality of storage die controllers $200_1, 200_2 \ldots 200_n$ that manage read and write requests to blocks of data in pages of storage cells to groups of the storage dies $106_1, 106_2 \ldots 106_n$. A transformation layer $114_1, 114_2 \ldots 114_n$ for each of the storage die controllers $200_1, 200_2 \ldots 200_n$ transforms a received number of bits (e.g., k bits) in pages of data from the host to write to storage cell groups of multiple storage cells (each storing m bits, where m is >=k) in the storage dies $106_1, 106_2 \ldots 106_n$ and to transform a read m number of bits in a block to the fewer number of k bits of the block of data to return in pages to the host. A host operating system may code pages of data for the memory controller, where multiple of the pages provide the data for each of the multi-level storage cells, such as if each storage cell stores n bits, the host operating system would provide n pages to provide each of the n bits to code in a storage cell.

The transformation layer $114_1, 114_2 \ldots 114_n$ uses the state mappings $300_1, 300_2 \ldots 300_n$ to determine the translation functions to use to transform the fewer k bits to m bits and vice versa. In certain embodiments, the mapping operations for k bits in the received pages to the m bits stored in a storage cell group, and vice versa, are performed by the transformation layer $114_i$. In alternative embodiments, the mapping operations may be performed by the I/O logic 202, where the transformation layer $114_i$ is implemented in the I/O logic 202.

For instance, if each multi-level cell comprises n bits, then storage device 100 provides $2^n$ different threshold voltage levels to program the $2^n$ different states for a storage cell. If storage cells are grouped into groups of p storage cells each, then each storage cell group has $2^{np}$ states of information, and allow storage of m bits of information for a block of data, where m=$\text{Log}_2(2^{np})$ bits of information. The controller channel 102 and transformation layers $114_1, 114_2 \ldots 114_n$ may be programmed to only use j threshold voltage levels, less than the $2^n$ available threshold voltage levels. A storage cell group of p storage cells programmed to only use j threshold voltage levels would be capable of representing $j^p$ states with k bits of information, where k<m and k is a largest integer less than or equal to $\text{Log}_2(j^p)$.

The storage dies $106_1, 106_2 \ldots 106_n$ may comprise electrically erasable and non-volatile memory cells. For instance, the storage dies $106_1, 106_2 \ldots 106_n$ may comprise NAND dies of memory cells, also known as NAND chips or packages. In one embodiment, the NAND dies may comprise multilevel cell (MLC) NAND flash memories where each cell records two bit values, a lower bit value and an upper bit value. Alternatively, the NAND dies may comprise single level cell (SLC), multi-level cell (MLC), triple level cell (TLC) NAND memories, etc. The NAND dies, TLC, MLC, SLC, etc., may be organized in a three dimensional (3D) or two dimensional (2D) physical structure. The storage dies $106_1, 106_2 \ldots 106_n$ may further comprise ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAIVI), Spin Transfer Torque (STT)-MRAM, a single level cell (SLC) Flash memory and other electrically erasable programmable read only memory (EEPROM) type devices.

The non-volatile memory storage device 100 may include a data compression unit 112 to compress received data from the host interface 104, a data encryption unit 118 to encrypt the compressed data, and an error correction unit 120 to perform error correction operations, and scrambler units $116_1, 116_2 \ldots 116_n$ to scramble the encrypted and compressed data before the controllers $200_1, 200_2 \ldots 200_n$ write the data to the storage dies $106_1, 106_2 \ldots 106_n$. The data provided to the controller $200_1, 200_2 \ldots 200_n$ may be compressed and include fewer bits of data than stored in the storage cells of the storage dies $106_1, 106_2 \ldots 106_n$. In alternative embodiments, there may be only the data compression unit 112 and error correction unit 120, and not the encryption 118 and scrambler 116 units. In still further embodiments, the data compression unit 112, encryption unit 118, and/or scrambler units $116_1, 116_2 \ldots 116_n$ may be implemented in an external host system, such that fewer bits are provided to the host interface 104 to store than the number of bits stored in the storage cell.

The data from the host interface 104, that is subject to the compression 112, encryption 118, and error correction 120 is stored in a transfer buffer 124 from where it is transferred to the controllers $200_1, 200_2 \ldots 200_n$ and scrambled by the scrambler units $116_1, 116_2 \ldots 116_n$ to scramble before being written to the storage dies $106_1, 106_2 \ldots 106_n$.

The processing components in the non-volatile memory storage device 100, including the controllers $200_1$, $200_2$ ... $200_n$, compression unit 112, encryption unit 118, error correction unit 120, and scrambler units $116_1$, $116_2$ ... $116_n$ may be implemented as firmware or in one or more application specific integrated circuits (ASIC) within the non-volatile memory storage device 100. Alternatively, these components may be implemented in a software program executed by a processor of the non-volatile memory storage device 100.

The host interface 104 connects the memory device 100 to a host system (not shown). The memory device 100 may be installed or embedded within a host system, such as shown and described with respect to element 1708 or 1710 in FIG. 17, or the memory device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

In certain embodiments, the storage dies $106_1$, $106_2$ ... $106_n$ may comprise n-bit multi-level cells, where each cell can be programmed into $2^n$ states represented by $2^n$ different threshold voltage levels. For a multi-level cell (MLC) NAND flash memory storing 2 bits per cell, there may be four voltage thresholds, E, P1, P2, and P3 to represent the four states that may be programmed into cells. A tri-level cell (TLC) flash memory cell may be programmed with eight threshold voltage levels. In certain embodiments, the storage die controller $200_i$ may organize storage cells for writing into storage cell groups comprising p storage cells. For example, for an n-bit cell organized into a cell group of p, each cell group can store m bits of information, where $m=\log 2(2^{np})$, and each storage cell group may represent $2^{np}$ different states, which can be programmed with $2^{np}$ different voltage level combinations. The pages of cells may be organized into a block of pages, where an erase operation to restore the state of the cells to the E or erase state is performed on a block basis.

The transformation layers $114_1$, $114_2$ ... $114_n$ may receive a block of k bits of information to write, which is less than the m bits of information for a block in a storage cell group. The fewer k bits may result from compression or the host operating system being programmed to provide a block of data comprising k bits. To provide improved information on the location of an error to the error correction unit 120, the transformation layers $114_1$, $114_2$ ... $114_n$ may map the received k bits to a subset of the $2^{np}$ states that may be programmed in a storage cell group comprising p storage cells. In this way the possible $2^{np}$ states are divided into valid and invalid. If bits programmed in a storage cell group experience retention errors and leakage and at least one of the storage cells in the storage cell group transitions to a lower threshold level, then that storage cell group may transition to an invalid state. The transformation layers $114_1$, $114_2$ ... $114_n$ can provide information on the bits mapping to an invalid state to the error correction unit 120 to use to correct the errors for the read invalid state.

Figure 2:
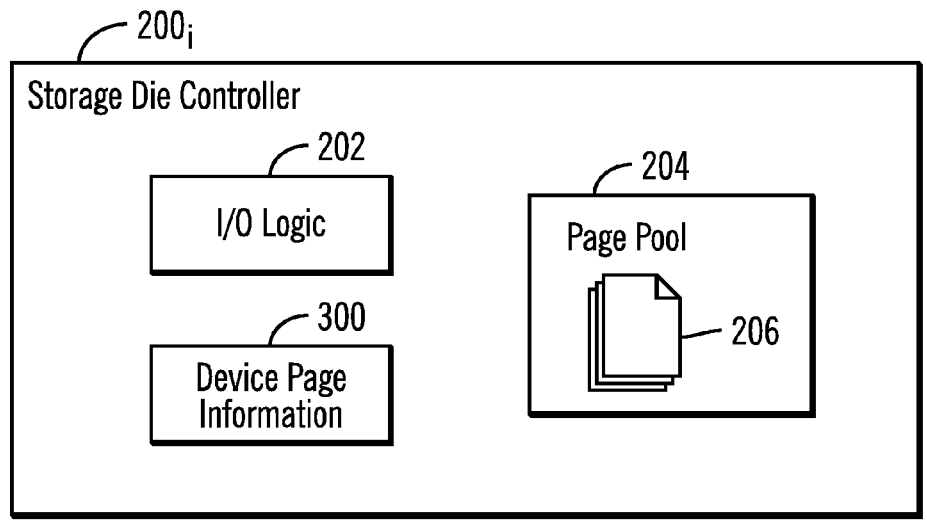
FIG. 2 illustrates an embodiment of a storage die controller.

FIG. 2 shows additional components that may be included in each storage die controller $200_i$ managing writes to a group of storage dies $106_i$, including Input/Output (I/O) logic 202 processes read/write commands from an attached host (not shown) in a command queue (not shown), from which the commands are accessed and executed. The I/O logic 202 maintains a page pool 204 of a plurality of available pages 206 for the storage dies $106_i$ and device page information 300 having information on device pages configured to use pages 206 from the page pool 204. Each device page having n bits per storage cell may be assigned n pages 206 from the page pool 204 to store the blocks of data. An MLC NAND having two bits per storage cell, has an upper and lower pages, a triple level cell (TLC), has three bits per storage cell and three pages for the three bits.

Figure 3:
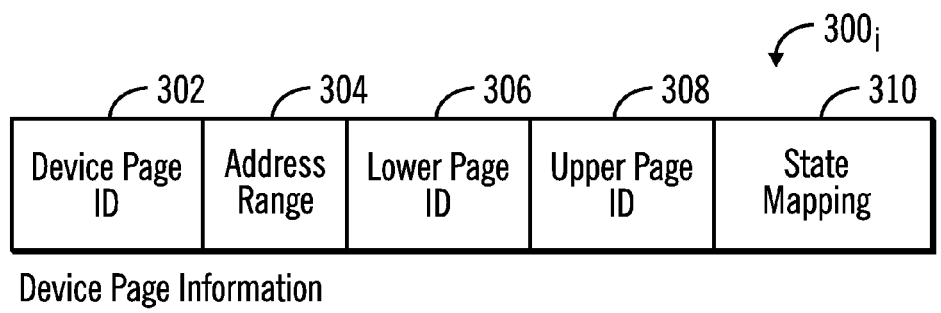
FIG. 3 illustrates an embodiment of device page information for a device page.

FIG. 3 illustrates an instance of device page information $300_i$ for a page of data storing the data for the n-bit storage cells, including a device page identifier 302, an address range 304 of addresses stored in the page $300_i$, a lower page identifier (ID) 306 identifying one of the pages 206 allocated as a lower page to store one bit of the storage cell; an upper page ID 308 to store one bit of the storage cell, where there may be n pages allocated to a device page for an n-bit storage cell; and a state mapping 310 indicating the state mapping providing the bit translation functions used to map the read data to the storage cell groups implemented in the pages 306, 308.

FIG. 3 illustrates upper and lower pages for an MLC NAND having two bits per storage cell. For a TLC, there would be three pages for the three bits per storage cell, and for a NAND having n bits per storage cell, there may be n pages. The pages map to address ranges in the storage dies $106_1$, $106_2$ ... $106_n$.

Figure 4:
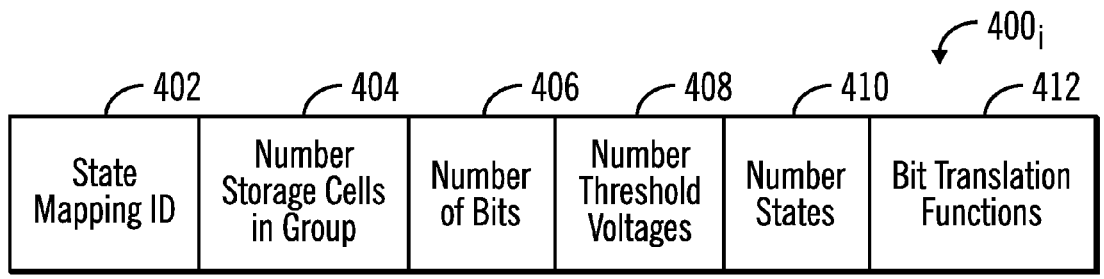
FIG. 4 illustrates an embodiment of a state mapping providing translations functions to transform bits received.

FIG. 4 illustrates an embodiment of a state mapping $400_i$ comprising one of the state mappings $400_1$, $400_2$ ... $400n$, as including a state mapping ID 402 identifying the mapping; a number of storage cells in a storage cell group 404 (p); a number of bits 406 of a received block to write to the storage cells in the storage cell group, or k, which may be less than the total number of m bits in a storage cell group; a number of threshold voltages 408 used for each cell of a storage cell group, where the number of threshold voltages 408 may comprise a subset of the total threshold voltages available for use, which may comprise a subset of the lowest threshold voltages for a set of threshold voltages; a number of total states 410 that may be programmed in a storage cell group, which comprises $2^{np}$; and bit translation functions 412, which may include cell mapping, to map the k received bits 406, or k, to valid states coded using the number of threshold voltages 408 per storage cell. The mapping may provide $2^k$ valid states and $2^{np}-2^k$ invalid states. If less than all the threshold voltage levels are used, then the number of valid states comprises $2^{jp}$, where j is the number of threshold voltage levels used, and j is less than $2^n$, where $2^n$ is the number of threshold voltage levels needed to implement an n level cell, where n is the number of bits that may be programmed in each cell.

For instance for a storage cell group comprising a storage cell pair, i.e., p=2, the number of possible states or bits of information that may be stored in a storage cell pair group is sixteen states or four bits of information that can be programmed with 16 threshold voltage level combinations. If the number of received bits is k, such as 3, then the number of valid states is $2^k$, e.g., $2^3=8$, even though there are sixteen total possible states for a storage cell group of 2 storage cells and four threshold voltage levels E, P1, P2, P3, allowing for half valid and half invalid states.

FIG. 5A illustrates an embodiment where all possible states 500 in a storage cell group may comprise valid states ("VS"), for instances where the total number of states of the read bits k is four which is equal to the number of possible states that may be programmed with the four available threshold levels (E, P1, P2, P3), which is sixteen. If one of the storage cells, e.g., cell 1, initially programmed at state 502, or P1 and P3, experiences retention errors and leakage, which causes the state cell 1 to fall one threshold voltage level to transition 504 to state 506, then the location error cannot be determined by reading cell 1 and cell 0 of a storage cell group, because the state 506 is a valid state, although not the state initially programmed state for cells$_{0,1}$. The error correction unit 120 in such case will use additional parity bits to detect and correct the error, including the location of the false storage cell and correct value at that location by performing normal error correction.

FIGS. 5B and 5C illustrate embodiments where there are valid and invalid states of the possible states. In the embodiments of FIGS. 5B and 5C, a storage cell group of cells 0, 1 programmed in a valid state experiencing a leakage of one threshold voltage level in either of its storage cells 0, 1 would transition to an invalid state. In this way, each invalid state has a limited number of possibilities of the initial programmed state. This greatly eliminates the search space for error. With described embodiments, there is at least one invalid state between any two valid states in the horizontal and vertical directions such if there is cell leakage in any cell of the storage cell group by one threshold voltage level, the resulting leaked state is an invalid state.

FIG. 5B illustrates an embodiment of possible states 520 in which half the states are valid states ("VS"), and the other half are invalid states ("IS"). If one of the storage cells in the storage cell group of cell 0, 1, initially programmed at state 522, or P1, P3, experiences leakage, then the state of cell 1 would fall one threshold voltage level to transition 524 to state 526, which is an invalid state. Upon reading a storage cell group of cells 0 and cell 1 having an invalid state 526 (P1, P2), then those bits can be marked as erroneous, and the error correction unit 120 can use that information with parity information to correct the data.

FIG. 5C illustrates an embodiment possible states 540 in which a quarter of the states are valid states ("VS"), and the remainder of invalid states ("IS"). If one of the storage cells, e.g., cell 1, initially programmed at state 542, or P1, P2, experiences leakage, then the state of cell 1 would to fall one threshold voltage level to transition 544 to invalid state 546 (P1, P1). FIG. 5C would allow errors to be determined with read data if a storage cell group experienced a loss of two threshold voltage levels because there are at least two threshold voltage levels between states in the horizontal direction.

The embodiments of FIG. 5B is most useful when the cells are most likely to experience a leakage of only one threshold voltage level. The embodiment of FIG. 5C may be useful when leakage can be one or two threshold voltage levels, so that an invalid state can result from cell leakage of two threshold voltage levels away. For instance, invalid state 546 (P1, P1) can be reached from a two threshold voltage level leakage from state 542 or from two single threshold voltage level leakages from state 548 (P2, E).

In certain embodiments, the multiple pages provide the bits to code in a storage cell group. In an MLC NAND, two pages provide the bits for each storage cell, where one page has the first most significant bits (MSB) and the other page has the least significant bits (LSBs) to another page, referred to as upper and lower pages. For a TLC NAND, the three bits for each storage cell are written to three different pages. In MLC NAND, data can be erased at a block at a time to set the storage cells to the E threshold voltage level. An entire page (usually 1 kB, 2 KB or 4 kB) is written together.

Figures 6A, 6B:
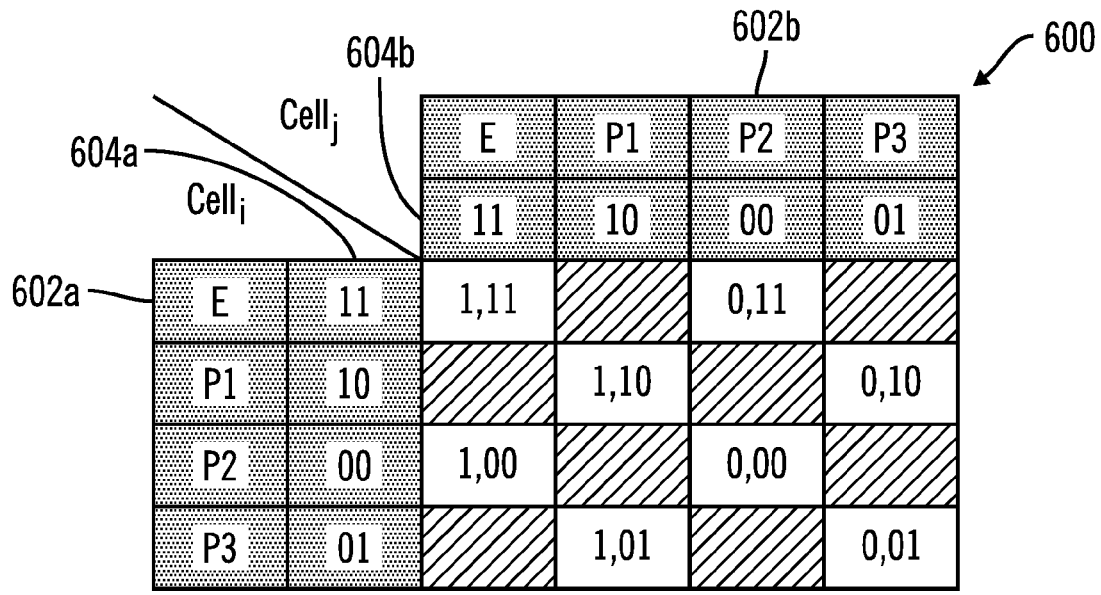
FIG. 6A illustrates an embodiment of a cell-to-bit mapping of threshold voltage levels for a storage cell pair to three bits of information when half the states are valid and half invalid.
FIG. 6B illustrates a truth table to map storage cell threshold voltage levels to four bits read from the storage and to the three bits to return.

FIG. 6A illustrates an embodiment of a cell-to-bit mapping 600 to map k=3 bits of information supplied by multiple of the pages (upper and lower or first and second pages) to a storage cell pair (i,j), where there are two storage cells in a storage cell group (p=2), and there are two bits stored in a cell, i.e., a MLC storage cell. The mapping 600 may be implemented in the bit translation functions 412 that would determine from the mapping 600 the threshold voltages to use to program the received k bits. The mapping 600 provides an embodiment where half the states are valid and half invalid, where valid states show the possible values of the three bits and invalid states are shown blank. The first column 602a shows the different programming states E, P1, P2, and P3 for cell$_i$ and the first row 602b shows the different programming states E, P1, and P2 for cell$_j$ of the storage cell pair. The second column 604a and second row 604b show the normal 2 bit coding for each storage cell, wherein the first bit is for a lower page and a second bit is for the upper page. The cells of the table show sixteen total states 410 and half valid states. Further, FIG. 6a as in FIG. 5B shows that leakage of one threshold voltage level from one valid state for any one cell i, j would result in an invalid state. The columns 602a and rows 602b show the threshold voltages to use for the first (cell$_i$) and second (cell$_j$) cells of the pair, respectively.

FIG. 6B shows a truth table 620 based on the mapping 600 that shows the different threshold voltage levels for the first cell in the voltage column 622a and for the second cell in the voltage column 622b, the full four bits in the bit column 624 coded by the threshold voltages 622a, 622b and the MSB and LSBs for the three bit values represented by the threshold voltages in the voltage columns 622a, 622b in the bit columns 626a, 626b, respectively. The truth table 620 only provides mappings for all possible 8 states of three bits 626a, 626b into sixteen possible states for the four bits 624 in a storage cell pair i, j. The states not shown in the truth table 620 for the four bits 624 of the storage cell pair comprise invalid states.

From the truth table 620, upon selecting three bits to write from pages in the transfer buffer 124, the MSB and LSBs of the received three bits are coded using the three threshold voltage levels s as shown in the columns 622a, 622b for the received three bits in the columns 626a, 626b. The truth table 620 is used to determine how the read and decoded four bit state from a storage cell pair, represented in the bits in column 624 maps to the received three bits 626a, 626b that were written to the storage cell pair.

The four bits read from the pair of storage cells may be translated to the received three bits based on the truth table 620 as follows, where $M_0$ is the MSB bit, $B_0$, $B_1$, $B_2$, $B_3$ correspond to the four bits read from a storage cell pair, $L_0$ is a first least significant bit of the three bits, $L_1$ is a second least significant bit:

(1) $M_0 = B_1$
(2) $L_0 = B_2$
(3) $L_1 = B_3$

Further, the bit $B_0$ can be presumed to be a parity bit and the read four bits $B_0$, $B_1$, $B_2$, $B_3$ may be XOR'd to determine whether they are an invalid or valid state, such that states with even parity, i.e., have an even number of 1s, are valid.

In further embodiments, logical expressions or functions other than XOR may be applied to the decoded bits to determine whether the result of the function indicates that the read four bits comprise a valid or invalid sate.

Thus, the bit translation function 412 in a state mapping 400$_i$ where the number of bits 406 in a block is three, the number of storage cells in a storage cell group 404 is two, the number of threshold voltages 408 is three, and the total number of states 410 is 16 implement the mappings 600 and truth table 620 of FIGS. 6A and 6B to map the received k bits 406 to a valid state represented by m bits stored in the storage cell group and then map the read m bits from a storage cell group to the received k bits to return to a host if the read four bits are a valid state, e.g., have odd parity. For instance, to map the read block of four bits from a storage cell pair of MLC NAND cells (n=2) to the initially received 3 bits, the above three translation functions (1), (2), and (3) can be used to translate the read four bits from the storage cell pair to the received three bits to return to the requesting host.

Figure 7A:
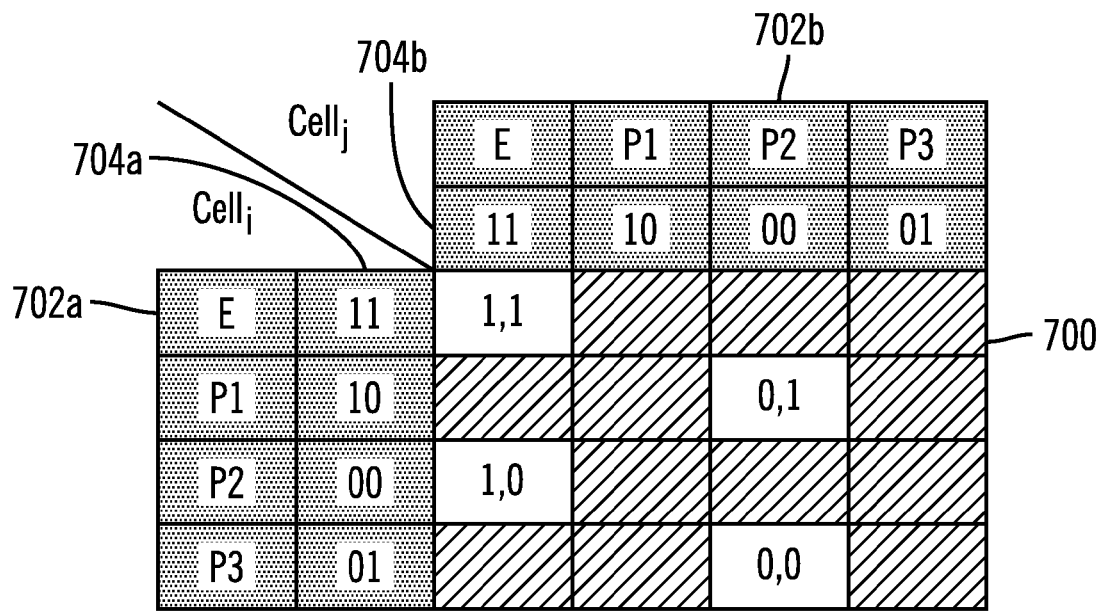
FIG. 7A illustrates an embodiment of a cell-to-bit mapping of threshold voltage levels for a storage cell pair to two bits of information when a quarter of the states are valid and three-quarters invalid.

FIG. 7A illustrates an embodiment of a cell-to-bit mapping 700 to map k=2 bits of information selected from two pages to a storage cell pair, where there are two storage cells in a storage cell group, and there are two bits stored in a cell (n=2_, i.e., a MLC storage cell. The mapping 700 provides an embodiment where one quarter of the states are valid and three quarters invalid, where valid states show the possible values of the two bits and invalid states are shown blank. The first column 702a shows the different programming states E and P1 for $cell_i$ and the first row 702b shows the different programming states E and P1 for $cell_j$ of the storage cell pair. The second column 704a and second row 704b show the normal 2 bit coding for each storage cell, wherein the first bit is for a lower page and a second bit is for the upper page. The cells of the table show the four possible states of the received two bits to store, and rows and columns show the threshold voltages to use for the first ($cell_0$) and second ($cell_1$) cells of the pair.

In FIG. 7A, the valid states are one-quarter of the total number of states and configured such that the average voltage distance between any two valid states comprises at least two threshold voltage levels.

Figure 7B:
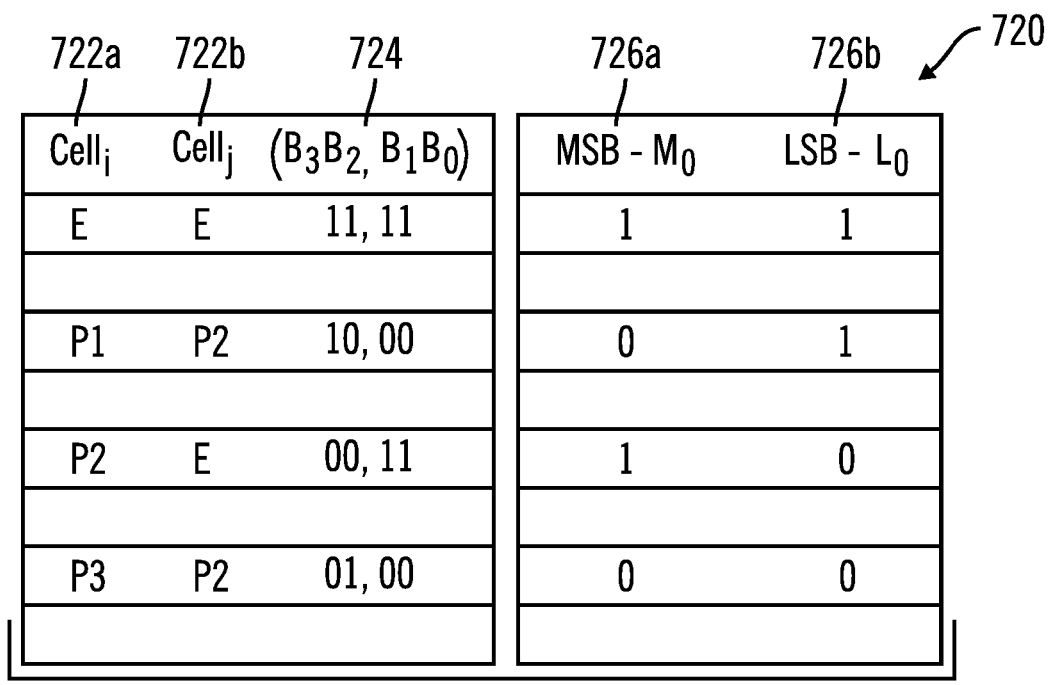
FIG. 7B illustrates a truth table to map storage cell threshold voltage levels to four bits read from the storage and to the two bits to return.

FIG. 7B shows a truth table 720 based on the mapping 700 that shows the different threshold voltages for the first cell in the voltage column 722a and for the second cell in the voltage column 722b, the full four bits in the bit column 624 coded by the threshold voltages 722a, 722b and the MSB and LSB for the two bit values represented by the threshold voltages in the voltage columns 722a, 722b in the bit columns 726a, 726b, respectively.

From the truth table 720, upon receiving the two bits to store, the MSB and LSB of the received two bits are coded using the threshold voltage levels as shown in the columns 722a, 722b for the received two bits in the columns 726a, 726b. The truth table 720 is used to determine how the read and decoded four bit state from a storage cell pair, represented in the four bits in column 724 maps to the received two bits 726a, 726b that were written to the storage cell pair.

The four bits read for a block from the pair of storage cells may be translated to the received block of two bits based on the truth table 720 as follows, where $M_0$ is the MSB bit, $B_0$, $B_1$, $B_2$, $B_3$ correspond to the four bits read from a storage cell pair, $L_0$ is the least significant bit of the two bits:

(4) $M_0 = B_2$ (5) $L_0 = B_0$

The invalid state of the decoded four bits may be determined by comparing the read voltage states ($B_0$, $B_1$, $B_2$, $B_3$) to the four valid states e.g. (V==11,11) or (V==10,00) or (V==00,11) or (V==01,00). This comparison may be performed using different logical operators, such as AND, OR, XOR, etc.

Thus, the bit translation function 412 in a state mapping $400_i$ where the number of bits 406 is two, the number of storage cells in a storage cell group 404 is two, the number of threshold voltages 408 is four, and the number of states 410 is sixteen, implement the mappings 700 and truth table 720 of FIGS. 7a and 7b to map the received two bits 406 to the four bits stored in the storage cell group and then map the read four bits from a storage cell group to the received two bits to return to a host. For instance, to map the read four bits from a storage cell pair of MLC NAND cells (n=2) to the initially received two bits, the above translation functions (4) and (5) can be used to translate the read four bits from the storage cell pair to the received two bits to return to the requesting host.

Figure 8:
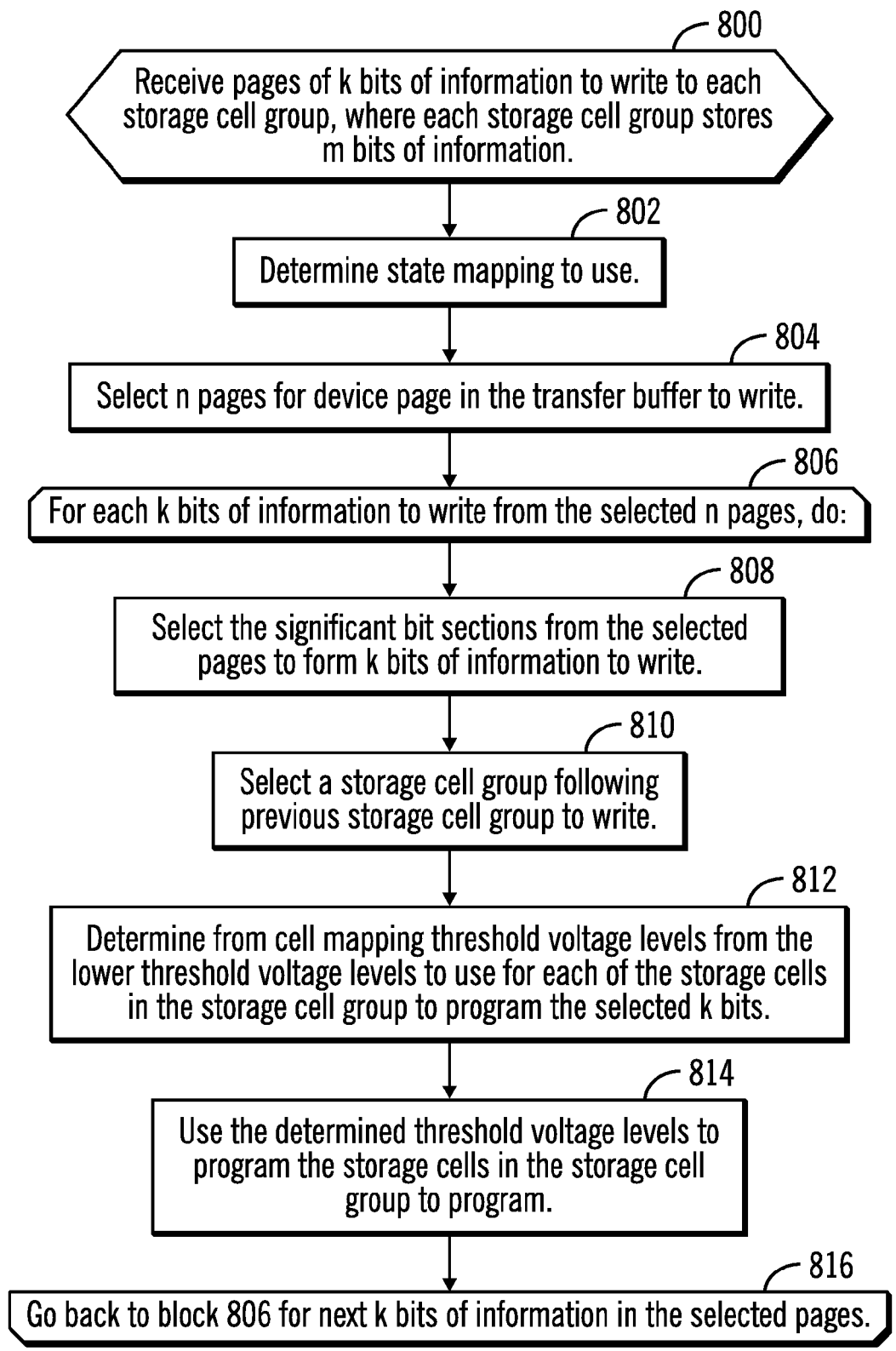
FIG. 8 illustrates an embodiment of operations to write multiple pages of data to device pages organized as a storage cell group(s).

FIG. 8 illustrates an embodiment of operations performed by the Input/Output (I/O) logic 202 and transformation layer $114_i$ to process pages in the transfer buffer 124 providing blocks of k bits of information to write to storage cell groups, where each storage cell group stores m bits of information, where m>k. The provided pages of k bits of information may comprise encrypted and compressed data of an original m bits, compressed by the compression unit 112 and then encrypted by the encryption unit 118. Further, certain of the provided m bits in pages may comprise parity bits generated by the error correction unit 120 for error correction operations. Upon processing (at block 800) multiple pages in a device page $300_i$ providing the k bits to write to storage ell groups, the I/O logic 202 or transformation layer $114_i$ determines (at block 802) the state mapping $400_i$ to use. The determined state mapping $400_i$ may be based on the mapping $400i$ having a number of bits 406 equal to the number of bits k for each received write in the page. Alternatively, the memory device 100 may be programmed to operate using a programmed state mapping $400_i$. The I/O logic 202 selects (at block 804) n pages in the transfer buffer 124 to write, where the n pages provide the n bits for each multi-level storage cell, e.g., two pages provides two bits for an MLC NAND, three pages provides three bits for a TLC NAND, etc.

For each instance of k bits of information in the selected n pages a loop of operations is performed at blocks 806 through 816. At block 808, the transformation layer 114 selects (at block 808) the significant bit sections, e.g., most significant bits (MSB), least significant bits (LSBs), etc., from the selected pages to form k bits of information to write. A storage cell group is selected (at block 810) comprising a first selected storage cell group or following the previous storage cell group written. The transformation layer $114_i$ determines (at block 812) from the cell mapping, e.g., FIG. 6a, 6b, 7a, 7b, the threshold voltage levels from the lower threshold voltage levels to use for each of the storage cells in the storage cell group to program the selected k bits. The selected threshold voltages may be from a subset of the lowest threshold voltage levels available for the storage cells. The transformation layer $114_i$ uses (at block 814) the determined threshold voltage levels to program the storage cells in the storage cell group to program. Before programming the m bits of information, the scrambler units $116_1$, $116_2$ ... $116_n$ may scramble the bits before writing.

FIGS. 9A and 9B provide an embodiment for programming three bits read from two pages to each storage cell group of two storage cells in two programming cycles. The storage cells each store two bits (n=2) and each storage cell group comprises a storage cell pair (p=2). The mappings show how to map the received three bits to the storage cells storing four bits, using the three lowest voltage levels. The arrows in FIG. 9B show the permissible voltage level changes to the state by programming one or both cells to one of the voltages P1, P2, P3 to produce valid states having at least one invalid state at the next threshold voltage in either the horizontal or vertical direction.

FIG. 9A shows the first step is to program one of the four values for the LSBs, to 11, 10, 00 or 01 during the first programming cycle, which would have been programmed during a block erase. During a first programming cycle, the first storage $cell_i$ of the pair is not programmed, programmed to P1, P2, P3 and the second storage cell$_j$ of the pair can be programmed to P1 or P3. With the first programming cycle, an invalid state is left between every pair of valid states in the vertical direction.

FIG. 9B shows a second programming step to program the MSB bit to a 1 by not performing any programming of either of the cells$_{i,j}$ or by programming just the second storage cell$_j$ two threshold voltage levels so the next valid state is two threshold voltage levels away, leaving an invalid state between two valid states in the horizontal direction. The direction of the arrows in FIG. 9B are always from a lower voltage level to a higher voltage level, which is a legal move in NAND programming.

FIG. 10 provides a table showing how the pair of storage cells$_{i,j}$ are programmed during the first and second programming cycles for the different possible three bits when the LSBs are programmed first, based on the table mappings shown in FIGS. 9A and 9B. The programming of FIG. 10 would be used when writing the LSBs first to one of the storage cell pairs. Different programming steps may be provided than those shown in FIG. 10 to program the LSB first.

FIGS. 11A and 11B provide an embodiment for programming the received block (e.g., read and write unit) of three bits in the storage cell group when the MSB bit is programmed first to the storage cell pair, where the storage cells each store two bits (n=2) and each storage cell group comprises a storage cell pair (p=2). The arrows in FIG. 11B shows the permissible voltage level changes to the states in FIG. 11A by programming one or both cells to the available four threshold voltage levels P1, P2, and P3 in a way that leaves an invalid state between any two valid states in either the horizontal or vertical directions.

FIG. 11A shows that no voltage needs to be applied to program the MSB to the E threshold voltage or "1", which would have been programmed before during a block erase. During a first programming step, programming the first storage cell$_i$ and the second storage cell$_j$ of the pair to the P2 threshold voltage programs the MSB to "0".

FIG. 11B shows a second programming step to program the LSB bits with an MSB bit of 1 by setting the cells$_{i,j}$ to one of the four threshold voltage levels E, P1, P2, and P3. No voltage needs to be applied to program the LSBs to the E threshold voltage to program a "11" when the MSBs is "1". FIG. 11B shows that the LSBs are programmed when the MSB is first programmed to "1" by: (1) programming the first cell$_0$ of the pair to the P2 threshold voltages to program the LSBs to "00"; (2) programming the first storage cell$_0$ to P1 and second storage cell$_j$ of the pair to the P1 threshold voltage to program the LSBs to "10"; and (3) programming the first cell$_0$ to P3 and the second cell$_j$ to the P1 threshold voltage to program the LSBs to "01". FIG. 11B further shows that the LSBs are programmed when the MSB is first programmed to "0" by: (1) programming the first cell$_i$ to the P2 threshold to program the LSBs to "00"; (2) programming the storage cells$_{i,j}$ to P3 to program the LSBs to "01"; and (3) programming the first storage cell$_i$ of the pair to the P1 threshold voltage and the second storage cell$_j$ to P3 to program the LSBs to "10".

FIG. 12 provides a table showing how the pair of storage cells$_{i,j}$ are programmed during the first and second programming cycles for the different possible three input bits when the MSB is programmed first, based on the table mappings shown in FIGS. 11a, 11b, and 11c. The programming of FIG. 12 would be used when performing the writing of the MSBs and LSBs in FIGS. 11A and 11B, where the MSB is programmed first.

Figure 13A:
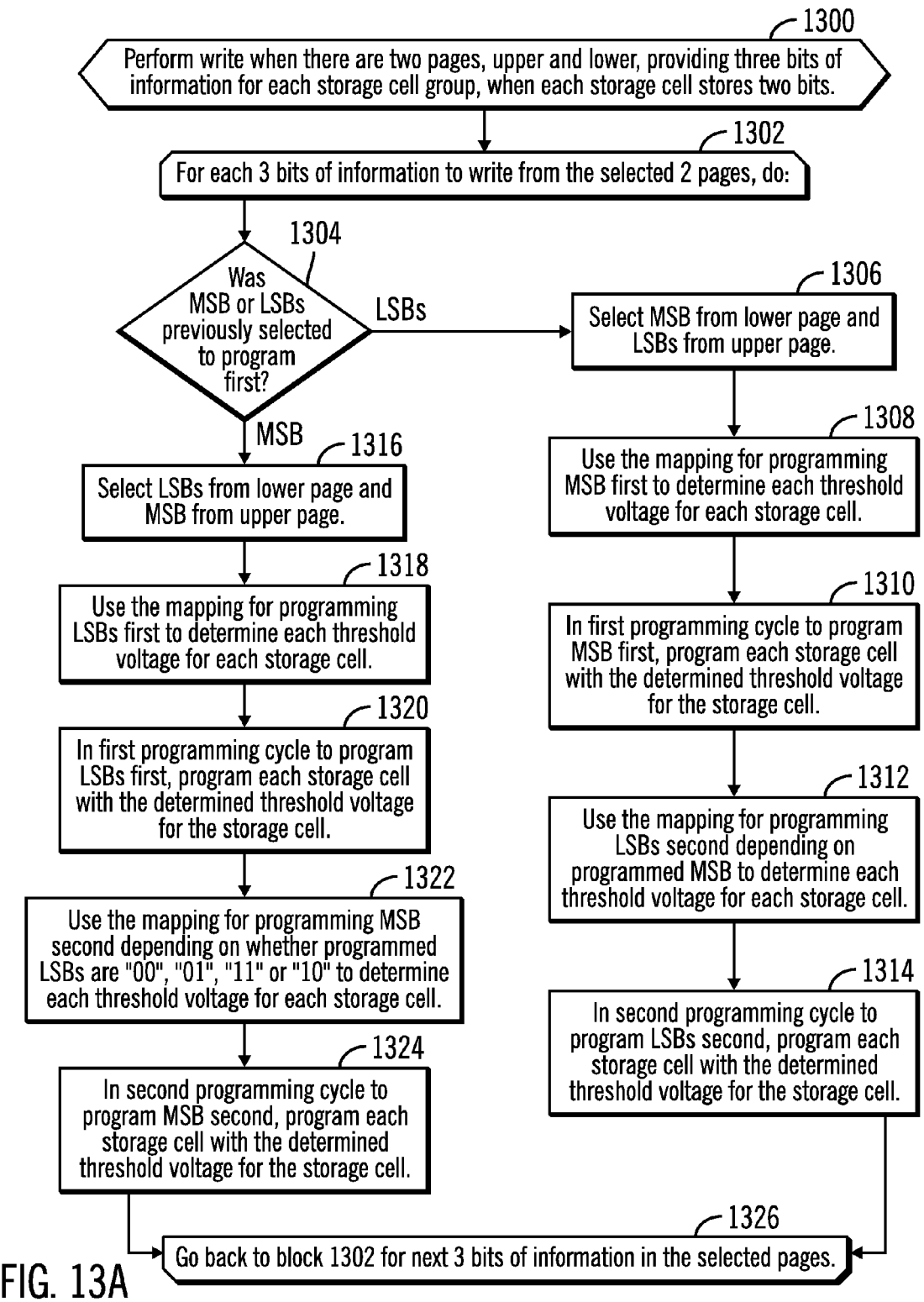
FIGS. 13A, 13B, 13C, 13D, and 13E provide operations for translating between the bits to write and the information on the bits stored.
Figure 13B:
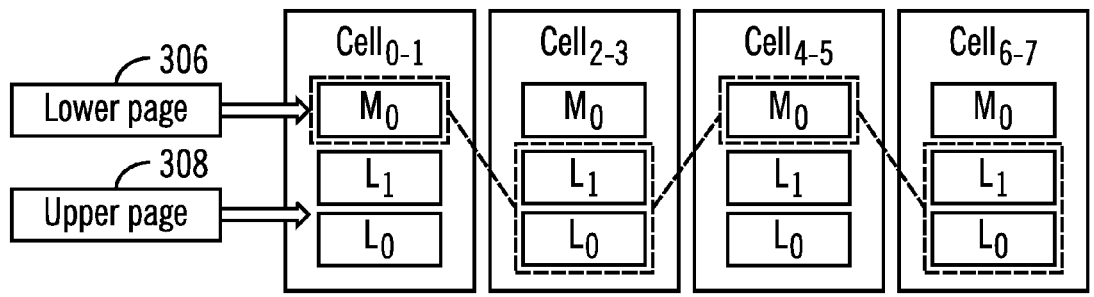
Figure 13C:
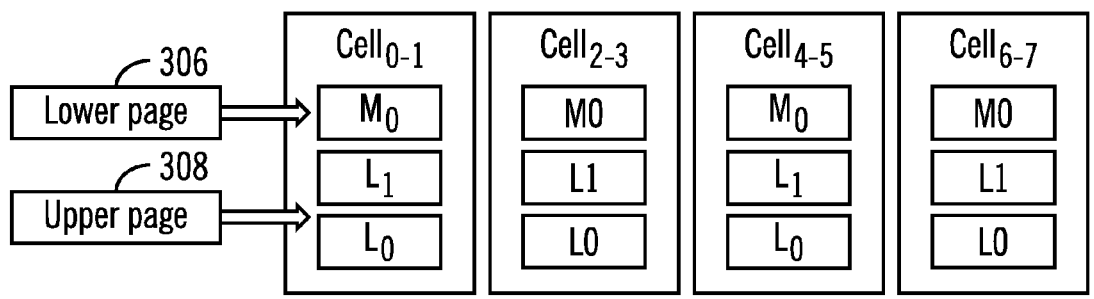

FIGS. 13A, 13B, and 13C illustrate different embodiments for performing the operations at blocks 806 and 808 using the mappings shown in FIGS. 9A, 9B, 9C, 10, 11A, 11B, 11C, 12 in embodiments where each storage cell comprises a storage cell pair of two storage cells (p=2) and each storage cell has 2 bits (n=2), and each device page 300$_i$ is allocated two pages, a lower 306 and upper 308, such as the case for an MLC NAND.

FIG. 13A illustrates an embodiment of operations to program the storage cell pairs when the number of received bits 406 for each block to write from the selected two pages, upper and lower, is three and each storage cell group is a pair of two storage cells (n=2). A mentioned, the three selected bits from the pages may be compressed, encrypted, and include error correction codes. Upon initiating the write (at block 1300) for selected upper and lower pages, the transformation layer 114$_i$ performs a loop of operations at blocks 1302 through 1326 for each 3 bits of information to write from the two pages. At block 1304, a determination is made as to whether the one MSB or the LSBs were selected to program first for the last storage cell pair written. If (at block 1304) the LSBs were programmed first for a previous storage cell pair or if the current storage cell to program is the first to program, the transformation layer 114$_i$ selects (at block 1306) the MSB from the selected lower page and the two LSBs from the upper page. The mapping for the programming the MSB first (FIG. 11A, 12) is used (at block 1308) to determine each threshold voltage for each storage cell of the storage cell pair being programming. In a first programming cycle to program the MSB first, each storage cell of the pair is programmed (at block 1310) with the determined threshold voltage for the storage cell. The transformation layer 114$_i$ uses (at block 1312) the mapping for programming LSBs second (as in FIGS. 11B, 12) depending on whether the MSB was programmed to a 1 or 0 to determine each threshold voltage for each storage cell. In a second programming cycle to program the two LSBs second, the transformation layer 114$_i$ programs (at block 1314) each storage cell with the determined threshold voltage for the storage cell.

If (at block 1304) the one MSB was programmed first for a previous storage cell pair or if the current storage cell to program is the first to program, the transformation layer 114$_i$ selects (at block 1316) the MSB from the selected upper page and the two LSBs from the lower page. The mapping for the programming the LSBs first (FIG. 9A) is used (at block 1318) to determine each threshold voltage for each storage cell of the storage cell pair being programming. In a first programming cycle to program the LSBs first, each storage cell of the pair is programmed (at block 1320) with the determined threshold voltage for the storage cell. The transformation layer 114$_i$ uses (at block 1322) the mapping for programming MSB second (as in FIGS. 9A, 9B, 10) depending on whether programmed LSB s are "00", "01", "11", or "10" to determine each threshold voltage for each storage cell. In a second programming cycle to program the one MSB second, the transformation layer 114$_i$ programs (at block 1324) each storage cell with the determined threshold voltage for the storage cell.

FIG. 13B illustrates the operations of FIG. 13A in that the MSB and LSBs are alternately selected from the lower and upper pages between storage cell groups to alternate selecting the first MSB bit and two LSB bits between the lower 306 and upper 308 page. For instance as shown in FIG. 13B, for the first pair storage cells$_{0,1}$ the MSB (M$_0$) is selected from the lower page 306 and LSBs upper page 308 and then in cells$_{2,3}$ the MSB is alternately selected from the upper page 308 and the LSBs from the lower page 306.

FIG. 13C illustrates an alternative embodiment for selecting the MSB and LSB bits when there are three bits to select from two pages by always selecting the MSB bit from the lower page 306 and always selecting the two LSB bits from the upper page 308.

The selection of pages to program together, such as at step 1300 of FIG. 13A, may be based on the page size after compression (i.e. compression ratio), e.g. to map two pages with similar size. FIGS. 13B and 13C may be used to map two pages with a two-time size difference.

Figure 13D:
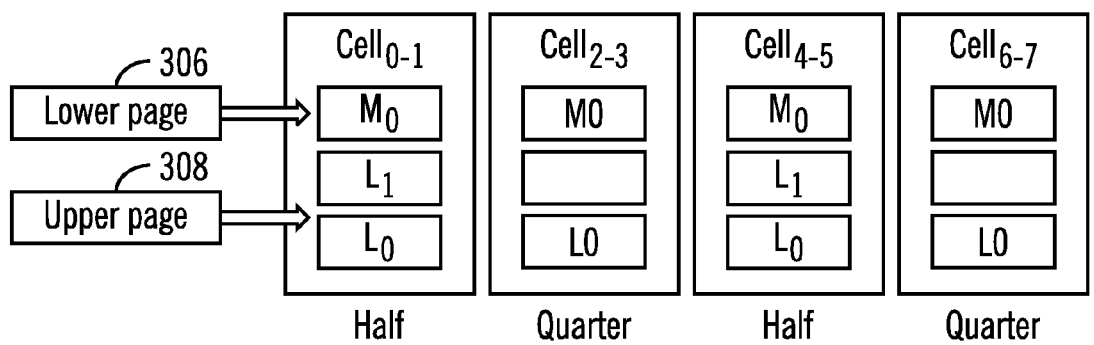

FIG. 13D illustrates an alternative embodiment for selecting the MSB and LSB bits when the writing the storage cell groups switch between half states and quarter states, such that every other storage cell group is a half state and every other is a quarter state.

Figure 13E:
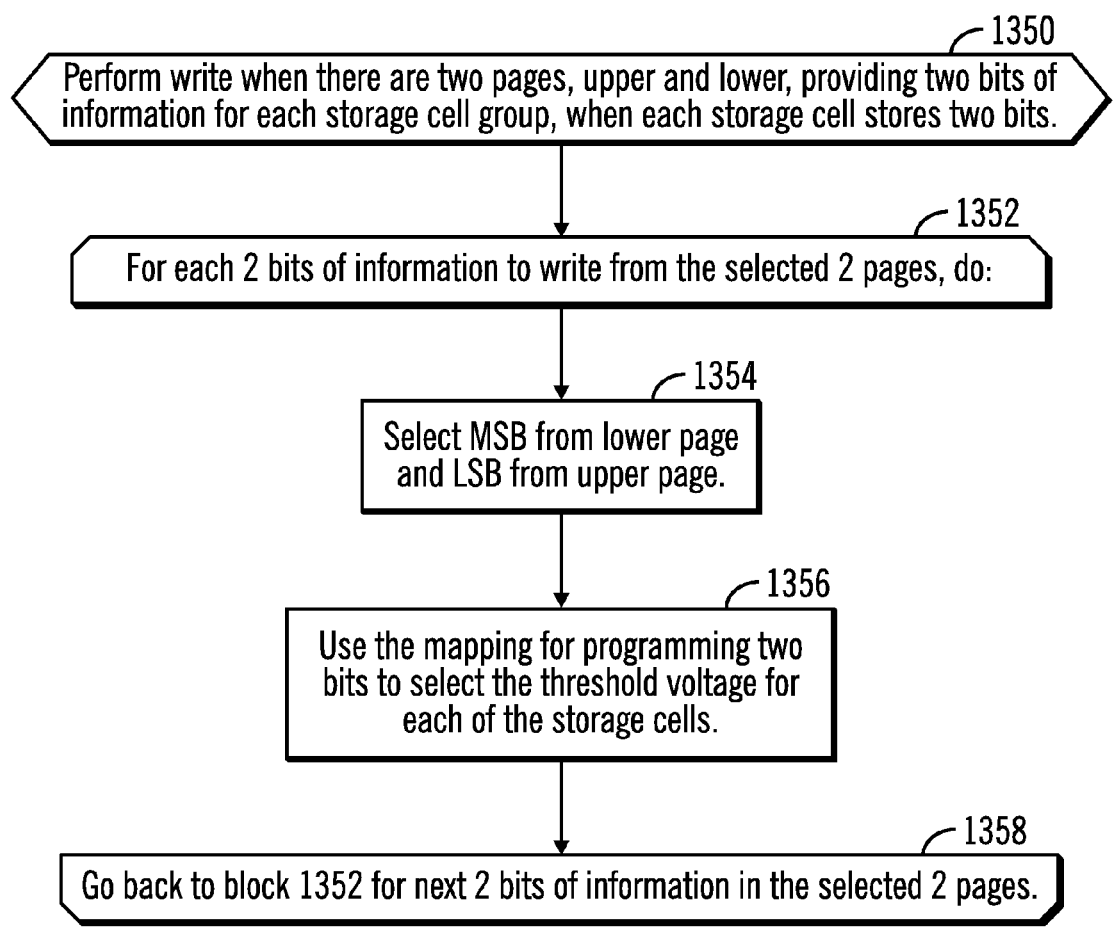

FIG. 13E illustrates an embodiment of operations to perform the programming cycles when the two pages provide blocks of two bits to write and each storage cell group is a pair of two storage cells and where each of the selected pages 306 or 308 provides one bit for every other storage cell. Upon initiating (at block 1350) the writing, the transformation layer 114$_i$ performs a loop of operations at blocks 1352 through 1358 to transform the received 2 bits per storage cell pair. The MSB and LSBs are selected (at block 1354) from the lower and upper pages, respectively. The mapping (FIGS. 7A, 7B) for programming two bits, one from each of the pages, is used (at block 1356) to select the threshold voltage levels from each of the storage cells, where only the two lowest threshold voltage levels need to be used to program all possible states of the storage cell pair having just two bits.

Although FIGS. 13A, 13B, 13C, 13D, and 13E are described with respect to an embodiment of storage cells storing two bits (n=2) and each storage cell group comprising a storage cell pair (p=2), the writing of the fewer number of received k bits to a group of storage cells storing m bits can be extended to other size storage cell groups and storage cells storing more than two bits by alternating the pages to which the fewer number of the MSB bits are written. Alternating the pages to which the smaller number of the MSB bits of the k bits are written distributes the smaller number of MSB bits and larger number of LSBs among the pages to provide wear leveling of the writing to the pages.

Figure 14:
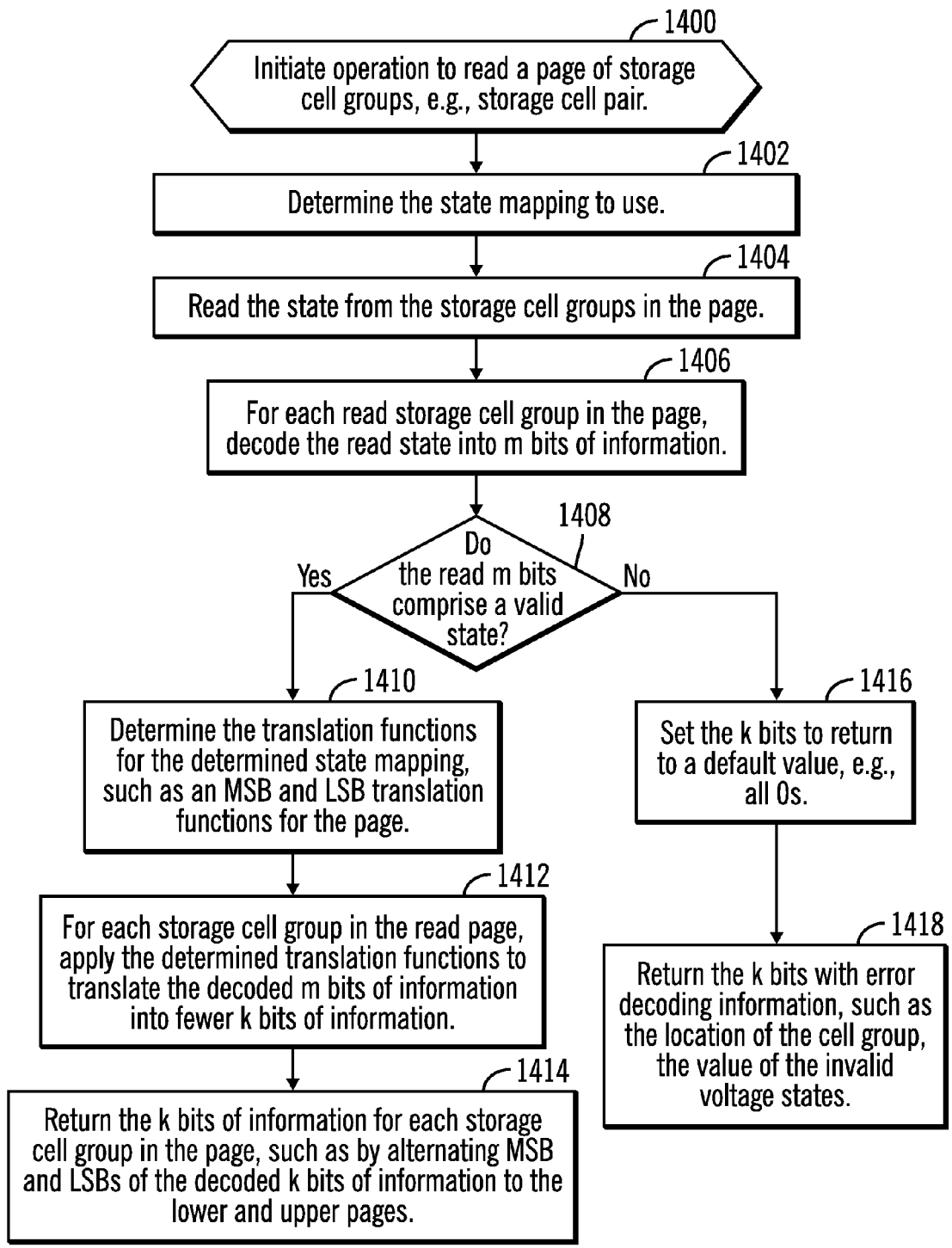
FIG. 14 illustrates an embodiment of operations to read a storage cell pair.

FIG. 14 illustrates an embodiment of operations performed by the I/O logic 202 and/or the transformation layer 114$_i$ to read a page of blocks of data in storage cell groups, such as when each block is stored in a storage cell pair. Upon initiating (at block 1400) the read operation for a device page 300$_i$ of storage cell groups, the I/O logic 202 determines (at block 1402) the state mapping 400$_i$ to use, which may be indicated in the device page information 300$_i$ for the page to read or may be determined from an operational mode of the memory storage device 100. The state from the storage cell group in the device page 300$_i$ is read (at block 1404), such as a threshold voltage level for each of the p storage cells in the storage cell group. The I/O logic 202 decodes (at block 1406) the read state represented by read threshold voltage levels from the p cells in the storage cell group. A determination is made (at block 1408) whether the read m bits are in a valid state, such as by performing an XOR of the read m bits to determine if they have odd parity, or an even number of 1s, which indicates a valid state.

If (at block 1408) the m bits are in a valid, then the transformation layer 114$_i$ determines (at block 1410) the bit translation functions 412 for the read m bits of information for a device page 300$_i$, such as the translation functions (1), (2), and (3) described above with respect to a storage cell pair where k=3 bits and where k=2 bits. The transformation layer 114$_i$ applies (at block 1412), for each storage cell group in the read page, the determined translation functions to translate the decoded m bits of information to a block of fewer k bits of information and returns (at block 1414) the block of k bits and indication of the k bits that are marked as erroneous to the host requesting the page of data. In returning the translated k (or 3 bits), the transformation layer 114$_i$ may alternately write the MSB and LSBs read for each storage cell pair when writing the bits to upper and lower pages.

If (at block 1408) the m bits do not map to a valid state in the state mapping 400$_i$, then the m bits and the k bits translated therefrom are set (at block 1410) to a default invalid value, such as all 0s. The k bits set with the default error value are returned (at block 1418) with error decoding information, such as the location of the cell group, the value of the invalid voltage states, etc.

Figure 15:
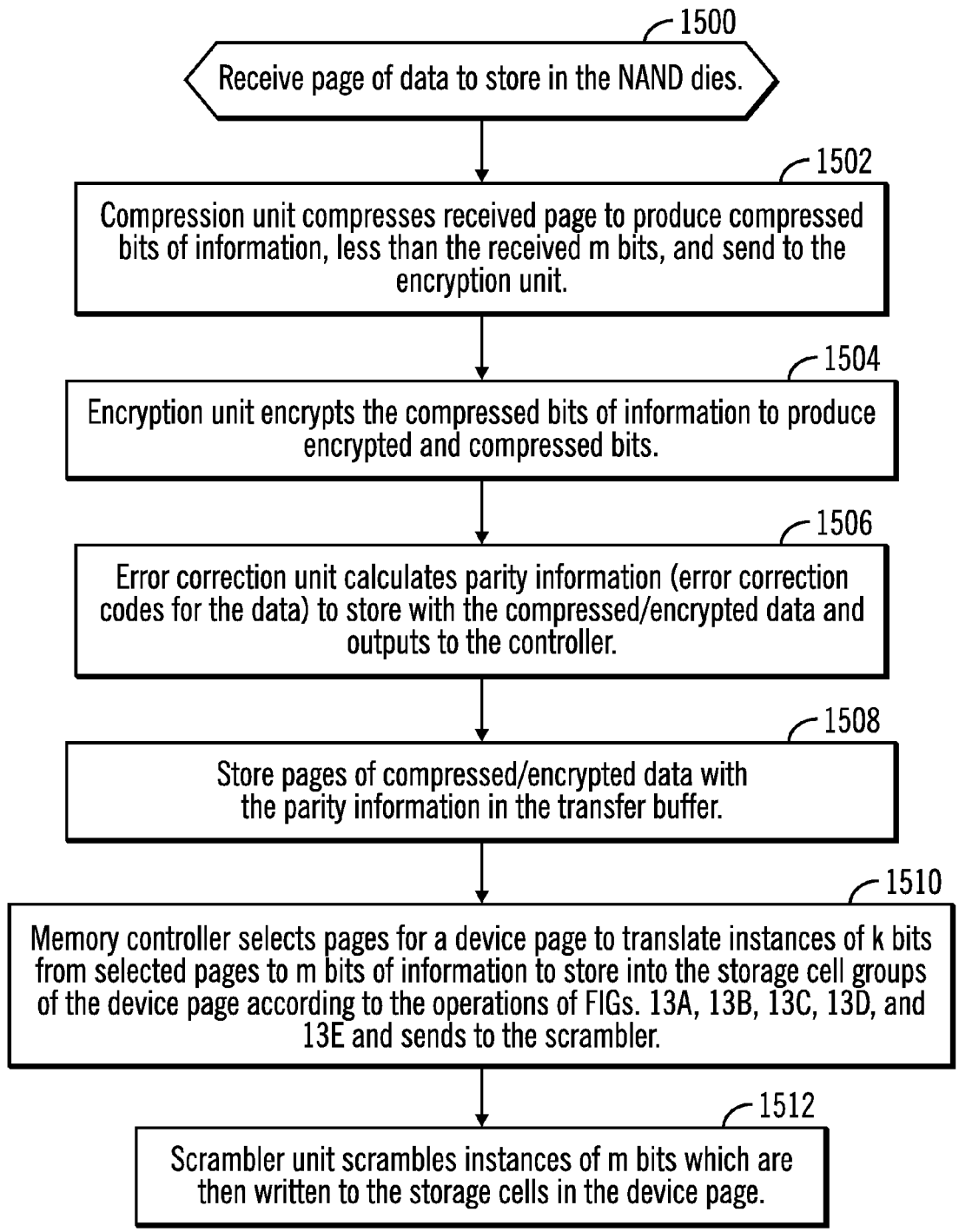
FIG. 15 illustrates an embodiment of operations to compress, encrypt, error correction code, and scramble a page of data.

FIG. 15 illustrates an embodiment of operations performed by the components of the non-volatile memory storage device 100 to process a page of bits of information to store in the storage dies 106$_1$, 106$_2$ ... 106$_n$, including the data compression unit 112, data encryption unit 118, error correction unit 120, scrambler unit 116$_i$, and controller 200$_i$. Upon receiving (at block 1500) a page of data to store in the NAND storage dies 106$_1$, 106$_2$ ... 106$_n$ the compression unit 112 compresses (at block 1502) the received page to produce instances of compressed bits of information and sends to the encryption unit 118. The encryption unit 118 encrypts (at block 1504) the compressed bits of information in the page to produce encrypted and compressed bits of information. The error correction unit 120 calculates (at block 1506) parity information, e.g., error correction codes for the data, to store with the compressed/encrypted data and outputs the page to the controller channel 102. The pages of the compressed/encrypted data with the parity information are stored (at block 1508) in the transfer buffer 124. The storage die controller 200$_i$ and transformation layer 114$_i$ selects (at block 1510) the pages for a device page to translate instances of k bits from the selected pages to m bits of information to store in the storage cell groups of the device page according to operations of FIGS. 13A, 13B, 13C, 13D, and 13E and sends to the scrambler unit 116$_i$. The scrambler unit 116$_i$ scrambles (at block 1510) instances of the translated m bits in a device page which are then written to the storage cells in the storage die 106$_i$.

Figure 16:
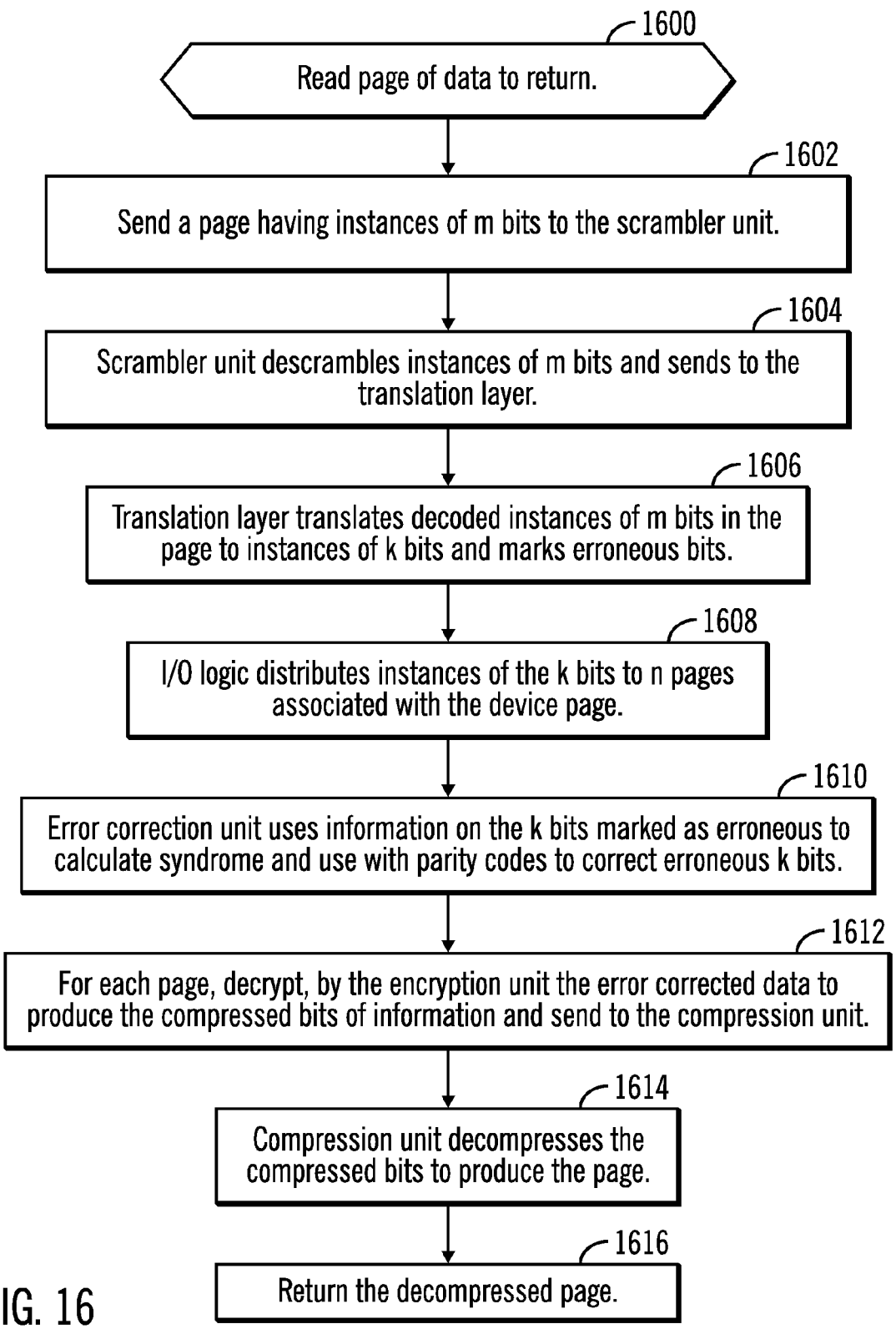
FIG. 16 illustrates an embodiment of operations to descramble, error correct, decrypt, and decompress data in a storage device.

FIG. 16 illustrates an embodiment of operations performed by the components of the non-volatile memory storage device 100 to process data read from the storage dies 106$_1$, 106$_2$ ... 106$_n$, including the data compression unit 112, data encryption unit 118, scrambler unit 116$_i$, and controller 200$_i$. Upon reading (at block 1600) a page of data to return from storage cell pairs in a storage die 106$_i$, the page having instances of m bits is sent (at block 1602) to the corresponding scrambler unit 116$_i$ for the storage die 106$_i$. The scrambler unit 116$_i$ descrambles (at block 1604) the instances of m bits in the page and sends to the translation layer 114$_i$ The translation layer 114$_i$ translates (at block 1606) the instances of read m bits from the page into the instances of k bits and marks k bits as erroneous if translated from an invalid state according to the operations of FIG. 14. The I/O logic 202 distributes (at block 1608) instances of the k bits to n pages associated with the device page 500$_i$. The error correction unit 120 uses (at block 1610) error information including information on the k bits having the invalid state and parity codes to correct erroneous k bits. The error correction unit 120 may perform erasure correction, which comprises error correction with the known location, or storage cell group, experiencing the error/invalid state. The encryption unit 118 decrypts (at block 1612) the error corrected bits for each page to produce the page having compressed bits of information and sends to the compression unit 112. The compression unit 112 decompresses (at block 1614) the page to produce the decompressed pages to return (at block 1614).

With the described operations of FIGS. 13A, 13E, and 14, the transformation layer 114$_i$ or I/O logic 202 uses the normal page mapping by writing to the same storage cells without requiring special translation to manage the page and track size, because the described embodiments read the data for all the storage cells on the page boundaries, but translates the read m bits of information into a block of fewer k bits provided by a host operating system. Further, the described embodiments improve error correction by providing exact information on the bits or storage cells experiencing an error, or erasure information.

Figure 17:
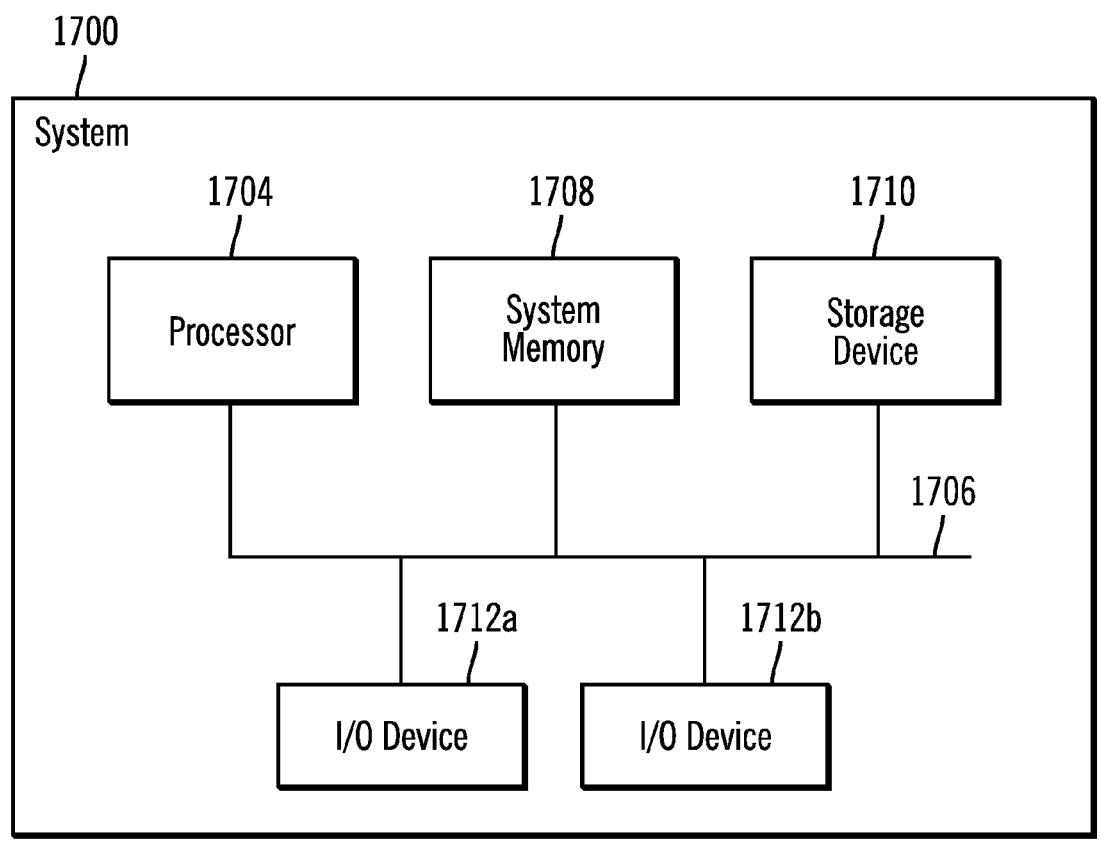
FIG. 17 illustrates a system in which the memory device of FIG. 1 may be deployed.

FIG. 17 illustrates an embodiment of a system 1700 in which the memory device 100 may be deployed as the system memory device 1708 and/or a storage device 1710. The system includes a processor 1704 that communicates over a bus 1706 with a system memory device 1708 in which programs, operands and parameters being executed are cached, and a storage device 1710, which may comprise a solid state drive (SSD) that stores programs and user data that may be loaded into the system memory 1708 for execution. The processor 1704 may also communicate with Input/Output (I/O) devices 1712a, 1712b, which may comprise input devices (e.g., keyboard, touchscreen, mouse, etc.), display devices, graphics cards, ports, network interfaces, etc. The memory 1708 and storage device 1710 may be coupled to an interface on the system 1700 motherboard, mounted on the system 1700 motherboard, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i, j, m, n, and p are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment.

Thus, the claims following the detailed description are hereby expressly incorporated into this detailed description.

EXAMPLES

The following examples pertain to further embodiments.

Example 1 is an apparatus for programming states of storage cells to provide error location information for retention errors, comprising: a non-volatile memory having storage cells, wherein each storage cell is programmed with information using a plurality of threshold voltage levels, and wherein each storage cell is programmed from bits from a plurality of pages; and a memory controller configured to program the storage cells and to: organize the storage cells in the non-volatile memory into storage cell groups, wherein each storage cell group stores m bits of information, wherein each of the storage cells in each of the storage cell groups is programmed with the plurality of threshold voltage levels; select k bits from the pages to write for one storage cell group, wherein k<m, and wherein k and m are integer values greater than zero; and determine one threshold voltage level to use for each of the storage cells in the storage cell group to program the selected k bits in the storage cell group, wherein each k bits are programmed with threshold voltage levels defining one of a plurality of valid states, wherein the threshold voltage levels for at least one of the storage cells of the storage cell group in any two valid states differ by at least two threshold voltage levels.

In Example 2, the subject matter of examples 1 and 3-11 can optionally include that the threshold voltage levels for the storage cells in a storage cell group are capable of programming a total number of states for a storage cell group including valid states in which the selected k bits are programmed and invalid states in which the selected k bits are not programmed.

In Example 3, the subject matter of examples 1, 2 and 4-11 can optionally include that the threshold voltage levels for the storage cells in the storage cell groups define the valid states and the invalid states such that the storage cells of the storage cell group programmed in any valid state experiencing leakage of one threshold voltage level would transition to an invalid state.

In Example 4, the subject matter of examples 1-3 and 5-11 can optionally include that the valid states are one-half of the total number of states and configured such that if the k bits programmed into the storage cells of one of the storage cell groups in one of the valid states experience leakage of one threshold voltage level, then the leakage would result in the storage cells representing the k bits transition to one of the invalid states.

In Example 5, the subject matter of examples 1-4 and 6-11 can optionally include that the valid states are one-quarter of the total number of states and configured such that an average voltage distance between any two valid states comprises at least two threshold voltage levels.

In Example 6, the subject matter of examples 1-5 and 7-11 can optionally include that the memory controller is further to: read threshold voltage levels for the storage cells in one of the storage cell groups; decode the read threshold voltage levels to obtain decoded m bits; determine whether the decoded m bits comprise one of the valid states; translate the decoded m bits to k bits to return; and mark the k bits as erroneous in response to determining that the decoded m bits do not comprise one of the valid states.

In Example 7, the subject matter of examples 1-6 and 8-11 can optionally include that the determine whether the decoded m bits comprise one of the valid states comprises:

perform a logical function on the decoded m bits, wherein the valid state is determined if a result of the logical function on the decoded m bits has a first value and wherein the invalid state is determined if the result of the logical function on the decoded m bits has a second value.

In Example 8, the subject matter of examples 1-7 and 9-11 can optionally include that an error correction unit to generate error correction information for the k bits, wherein in response to determining that the decoded m bits comprise one of the invalid states, the memory controller is further to: set the k bits to a default error value; and provide information to the error correction unit on the k bits having one of the invalid states to provide error correction to the k bits.

In Example 9, the subject matter of examples 1-8 and 10-11 can optionally include that the memory controller is further to: provide translation functions based on a truth table associating each possible k bits with the valid states; and use the translation functions to translate the selected k bits of information to the m bits to program in one of the storage cell groups and to translate a read m bits of information from one of the storage cell groups to the k bits of information.

In Example 10, the subject matter of examples 1-9 and 11 can optionally include that there are at least two significant bit sections of the k bits of information, wherein select the k bits from the pages for a current storage cell group comprises selecting significant bit sections from different pages from which the significant bit sections were selected for a previous storage cell group.

In Example 11, the subject matter of examples 1-10 can optionally include that the memory controller is further to: read the m bits of information from one of the storage cell groups; translate the read m bits of information to a translated k bits of information; and for each storage cell group, alternate writing the significant bit sections of the translated k bits of information to different pages to which the significant bit sections were written for a previous storage cell group.

Example 12 is a system for programming states of storage cells to provide error location information for retention errors, comprising: a processor; a bus, wherein the processor is coupled to the bus; and a non-volatile memory having: storage cells, wherein each storage cell is programmed with information using a plurality of threshold voltage levels, and wherein each storage cell is programmed from bits from a plurality of pages; and a memory controller configured to program the storage cells and to: organize the storage cells in the non-volatile memory into storage cell groups, wherein each storage cell group stores m bits of information, wherein each of the storage cells in each of the storage cell groups is programmed with the plurality of threshold voltage levels; select k bits from the pages to write for one storage cell group, wherein k<m, and wherein k and m are integer values greater than zero; and determine one threshold voltage level to use for each of the storage cells in the storage cell group to program the selected k bits in the storage cell group, wherein each k bits are programmed with threshold voltage levels defining one of a plurality of valid states, wherein the threshold voltage levels for at least one of the storage cells of the storage cell group in any two valid states differ by at least two threshold voltage levels.

In Example 13, the subject matter of examples 12 and 14-18 can optionally include that the threshold voltage levels for the storage cells in a storage cell group are capable of programming a total number of states for a storage cell group including valid states in which the selected k bits are programmed and invalid states in which the selected k bits are not programmed.

In Example 14, the subject matter of examples 12, 13 and 15-18 can optionally include that the threshold voltage levels for the storage cells in the storage cell groups define the valid states and the invalid states such that the storage cells of the storage cell group programmed in any valid state experiencing leakage of one threshold voltage level would transition to an invalid state.

In Example 15, the subject matter of examples 12-14 and 16-18 can optionally include that the valid states are one-half of the total number of states and configured such that if the k bits programmed into the storage cells of one of the storage cell groups in one of the valid states experience leakage of one threshold voltage level, then the leakage would result in the storage cells representing the k bits transition to one of the invalid states.

In Example 16, the subject matter of examples 12-15 and 17-18 can optionally include that the memory controller is further to: read threshold voltage levels for the storage cells in one of the storage cell groups; decode the read threshold voltage levels to obtain decoded m bits; determine whether the decoded m bits comprise one of the valid states; translate the decoded m bits to k bits to return; and mark the k bits as erroneous in response to determining that the decoded m bits do not comprise one of the valid states.

In Example 17, the subject matter of examples 12-16 and 18 can optionally include that the determine whether the decoded m bits comprise one of the valid states comprises: perform a logical function on the decoded m bits, wherein the valid state is determined if a result of the logical function on the decoded m bits has a first value and wherein the invalid state is determined if the result of the logical function on the decoded m bits has a second value.

In Example 18, the subject matter of examples 12-17 can optionally include that an error correction unit to generate error correction information for the k bits, wherein in response to determining that the decoded m bits comprise one of the invalid states, the memory controller is further to: set the k bits to a default error value; and provide information to the error correction unit on the k bits having one of the invalid states to provide error correction to the k bits.

Example 19 is a method for programming states of storage cells in a non-volatile memory to provide error location information for retention errors, comprising: programming storage cells in the non-volatile memory, wherein each storage cell is programmed with information using a plurality of threshold voltage levels, and wherein each storage cell is programmed from bits from a plurality of pages; organizing the storage cells in the non-volatile memory into storage cell groups, wherein each storage cell group stores m bits of information, wherein each of the storage cells in each of the storage cell groups is programmed with the plurality of threshold voltage levels; selecting k bits from the pages to write for one storage cell group, wherein k<m, and wherein k and m are integer values greater than zero; and determining one threshold voltage level to use for each of the storage cells in the storage cell group to program the selected k bits in the storage cell group, wherein each k bits are programmed with threshold voltage levels defining one of a plurality of valid states, wherein the threshold voltage levels for at least one of the storage cells of the storage cell group in any two valid states differ by at least two threshold voltage levels.

In Example 20, the subject matter of examples 19 and 21-25 can optionally include that the threshold voltage levels for the storage cells in a storage cell group are capable of programming a total number of states for a storage cell group including valid states in which the selected k bits are programmed and invalid states in which the selected k bits are not programmed.

In Example 21, the subject matter of examples 19, 20 and 22-25 can optionally include that the threshold voltage levels for the storage cells in the storage cell groups define the valid states and the invalid states such that the storage cells of the storage cell group programmed in any valid state experiencing leakage of one threshold voltage level would transition to an invalid state.

In Example 22, the subject matter of examples 19-21 and 23-25 can optionally include that the valid states are one-half of the total number of states and configured such that if the k bits programmed into the storage cells of one of the storage cell groups in one of the valid states experience leakage of one threshold voltage level, then the leakage would result in the storage cells representing the k bits transition to one of the invalid states.

In Example 23, the subject matter of examples 19-22 and 24-25 can optionally include reading threshold voltage levels for the storage cells in one of the storage cell groups; decoding the read threshold voltage levels to obtain decoded m bits; determining whether the decoded m bits comprise one of the valid states; translating the decoded m bits to k bits to return; and marking the k bits as erroneous in response to determining that the decoded m bits do not comprise one of the valid states.

In Example 24, the subject matter of examples 19-23 and 25 can optionally include that the determining whether the decoded m bits comprise one of the valid states comprises: performing a logical function on the decoded m bits, wherein the valid state is determined if a result of the logical function on the decoded m bits has a first value and wherein the invalid state is determined if the result of the logical function on the decoded m bits has a second value.

In Example 25, the subject matter of examples 19-24 can optionally include generating error correction information for the k bits, wherein in response to determining that the decoded m bits comprise one of the invalid states, further comprising: setting the k bits to a default error value; and providing information to an error correction unit on the k bits having one of the invalid states to provide error correction to the k bits.

In Example 26, the subject matter of example 19 can optionally include at least any one of:

(1) wherein the threshold voltage levels for the storage cells in a storage cell group are capable of programming a total number of states for a storage cell group including valid states in which the selected k bits are programmed and invalid states in which the selected k bits are not programmed; and/or (2) wherein the threshold voltage levels for the storage cells in the storage cell groups define the valid states and the invalid states such that the storage cells of the storage cell group programmed in any valid state experiencing leakage of one threshold voltage level would transition to an invalid state; and/or (3) wherein the valid states are one-half of the total number of states and configured such that if the k bits programmed into the storage cells of one of the storage cell groups in one of the valid states experience leakage of one threshold voltage level, then the leakage would result in the storage cells representing the k bits transition to one of the invalid states; and/or (4) wherein the valid states are one-quarter of the total number of states and configured such that an average voltage distance between any two valid states comprises at least two threshold voltage levels; and/or (5) reading threshold voltage levels for the storage cells in one of the storage cell groups; decode the read threshold voltage levels to obtain decoded m bits; determining whether the decoded m bits comprise one of the valid states; translating the decoded m bits to k bits to return; and marking the k bits as erroneous in response to determining that the decoded m bits do not comprise one of the valid states; and/or (6) wherein the determining whether the decoded m bits comprise one of the valid states comprises: performing a logical function on the decoded m bits, wherein the valid state is determined if a result of the logical function on the decoded m bits has a first value and wherein the invalid state is determined if the result of the logical function on the decoded m bits has a second value.

(7) generating, by an error correction unit, error correction information for the k bits, wherein in response to determining that the decoded m bits comprise one of the invalid states, setting the k bits to a default error value and providing information to the error correction unit on the k bits having one of the invalid states to provide error correction to the k bits; and/or (8) providing translation functions based on a truth table associating each possible k bits with the valid states; and using the translation functions to translate the selected k bits of information to the m bits to program in one of the storage cell groups and to translate a read m bits of information from one of the storage cell groups to the k bits of information; and/or (9) wherein there are at least two significant bit sections of the k bits of information, wherein select the k bits from the pages for a current storage cell group comprises selecting significant bit sections from different pages from which the significant bit sections were selected for a previous storage cell group; and/or

(10) reading the m bits of information from one of the storage cell groups;
translating the read m bits of information to a translated k bits of information; and for each storage cell group, alternating writing the significant bit sections of the translated k bits of information to different pages to which the significant bit sections were written for a previous storage cell group.

Example 27 is an apparatus for programming states of storage cells in a non-volatile memory to provide error location information for retention errors, comprising: means for programming storage cells in the non-volatile memory, wherein each storage cell is programmed with information using a plurality of threshold voltage levels, and wherein each storage cell is programmed from bits from a plurality of pages; means for organizing the storage cells in the non-volatile memory into storage cell groups, wherein each storage cell group stores m bits of information, wherein each of the storage cells in each of the storage cell groups is programmed with the plurality of threshold voltage levels; means for selecting k bits from the pages to write for one storage cell group, wherein k<m, and wherein k and m are integer values greater than zero; and means for determining one threshold voltage level to use for each of the storage cells in the storage cell group to program the selected k bits in the storage cell group, wherein each k bits are programmed with threshold voltage levels defining one of a plurality of valid states, wherein the threshold voltage levels for at least one of the storage cells of the storage cell group in any two valid states differ by at least two threshold voltage levels.

What is claimed:

1. An apparatus, comprising:
a non-volatile memory having storage cells, wherein each storage cell is programmed with information using a plurality of threshold voltage levels, and wherein each storage cell is programmed from bits from a plurality of pages; and
a memory controller configured to program the storage cells and to:
organize the storage cells in the non-volatile memory into storage cell groups, wherein each storage cell group stores m bits of information, wherein each of the storage cells in each of the storage cell groups is programmed with the plurality of threshold voltage levels;
select k bits from the plurality of pages to write for one storage cell group, wherein k<m, and wherein k and m are integer values greater than zero; and
determine one threshold voltage level to use for each of the storage cells in the storage cell group to program the selected k bits in the storage cell group, wherein the selected k bits are programmed with threshold voltage levels defining one of a plurality of valid states, wherein the threshold voltage levels for at least one of the storage cells of the storage cell group in any two valid states differ by at least two threshold voltage levels.

2. The apparatus of claim 1, wherein the threshold voltage levels for the storage cells in a storage cell group are configured to program a total number of states for a storage cell group including valid states in which the selected k bits are programmed and invalid states in which the selected k bits are not programmed.

3. The apparatus of claim 2, wherein the threshold voltage levels for the storage cells in the storage cell group define the valid states and the invalid states such that the storage cells of the storage cell group programmed in any valid state that experience leakage of one threshold voltage level transition to an invalid state.

4. The apparatus of claim 2, wherein the valid states are one-half of the total number of states and configured such that the selected k bits programmed into the storage cells of the storage cell group in one of the valid states that experience leakage of one threshold voltage level transition to one of the invalid states.

5. The apparatus of claim 2, wherein the valid states are one-quarter of the total number of states and configured such that an average voltage distance between any two valid states comprises at least two threshold voltage levels.

6. The apparatus of claim 2, wherein the memory controller is further to:
read threshold voltage levels for the storage cells in the storage cell group;
decode the read threshold voltage levels to obtain decoded m bits;
determine whether the decoded m bits comprise one of the valid states;
translate the decoded m bits to k bits to return; and
mark the k bits as erroneous in response to determining that the decoded m bits do not comprise one of the valid states.

7. The apparatus of claim 6, wherein to determine whether the decoded m bits comprise one of the valid states comprises:

perform a logical function on the decoded m bits, wherein a valid state is determined if a result of the logical function on the decoded m bits has a first value and wherein an invalid state is determined if the result of the logical function on the decoded m bits has a second value.

8. The apparatus of claim 6, further comprising:
an error correction unit to generate error correction information for the k bits,
wherein in response to a determination that the decoded m bits comprise one of the invalid states, the memory controller is further to:
set the k bits to a default error value; and
provide information to the error correction unit on the k bits having one of the invalid states to provide error correction to the k bits.

9. The apparatus of claim 1, wherein the memory controller is further to:
provide translation functions based on a truth table associating each possible k bits with the valid states; and
use the translation functions to translate the selected k bits to m bits to program in one of the storage cell groups and to translate a read m bits from one of the storage cell groups to the k bits.

10. The apparatus of claim 1, wherein there are at least two significant bit sections of the k bits, wherein to select the k bits from the pages for a current storage cell group comprises to select significant bit sections from different pages from which the significant bit sections were selected for a previous storage cell group.

11. The apparatus of claim 10, wherein the memory controller is further to:
read m bits of information from one of the storage cell groups;
translate the read m bits of information to a translated k bits of information; and
for each storage cell group, alternate to write the significant bit sections of the translated k bits of information to different pages to which the significant bit sections were written for a previous storage cell group.

12. The apparatus of claim 1, wherein the at least one of the storage cells of the storage cell group in any two valid states that differ by at least two threshold voltage levels comprise all the storage cells of the storage cell group in one of the valid states.

13. The apparatus of claim 10, wherein the memory controller is further to:
read m bits of information from one of the storage cell groups;
translate the read m bits of information to a translated k bits of information; and
for each storage cell group, write the significant bit sections of the translated k bits of information to same page to which the significant bit sections were written for a previous storage cell group.

14. A system, comprising:
a processor;
a bus, wherein the processor is coupled to the bus; and
a non-volatile memory having:
storage cells, wherein each storage cell is programmed with information using a plurality of threshold voltage levels, and wherein each storage cell is programmed from bits from a plurality of pages; and
a memory controller configured to program the storage cells and to:
organize the storage cells in the non-volatile memory into storage cell groups, wherein each storage cell group stores m bits of information, wherein each of the storage cells in each of the storage cell groups is programmed with the plurality of threshold voltage levels;

select k bits from the pages to write for one storage cell group, wherein k <m, and wherein k and m are integer values greater than zero; and determine one threshold voltage level to use for each of the storage cells in the storage cell group to program the selected k bits in the storage cell group, wherein the selected k bits are programmed with threshold voltage levels to define one of a plurality of valid states, wherein the threshold voltage levels for at least one of the storage cells of the storage cell group in any two valid states differ by at least two threshold voltage levels.

15. The system of claim 14, wherein the threshold voltage levels for the storage cells in a storage cell group are configured to program a total number of states for a storage cell group including valid states in which the selected k bits are programmed and invalid states in which the selected k bits are not programmed.

16. The system of claim 15, wherein the threshold voltage levels for the storage cells in the storage cell group define the valid states and the invalid states such that the storage cells of the storage cell group programmed in any valid state that experience leakage of one threshold voltage level transition to an invalid state.

17. The system of claim 15, wherein the valid states are one-half of the total number of states and configured such that the selected k bits programmed into the storage cells of the storage cell group in one of the valid states that experience leakage of one threshold voltage level transition to one of the invalid states.

18. The system of claim 15, wherein the memory controller is further to:
read threshold voltage levels for the storage cells in one of the storage cell groups;
decode the read threshold voltage levels to obtain decoded m bits;
determine whether the decoded m bits comprise one of the valid states;
translate the decoded m bits to k bits to return; and
mark the k bits as erroneous in response to determining that the decoded m bits do not comprise one of the valid states.

19. The system of claim 18, wherein to determine whether the decoded m bits comprise one of the valid states comprises:
perform a logical function on the decoded m bits, wherein a valid state is determined if a result of the logical function on the decoded m bits has a first value and wherein an invalid state is determined if the result of the logical function on the decoded m bits has a second value.

20. The system of claim 18, further comprising:
an error correction unit to generate error correction information for the k bits,
wherein in response to a determination that the decoded m bits comprise one of the invalid states, the memory controller is further to:
set the k bits to a default error value; and
provide information to the error correction unit on the k bits having one of the invalid states to provide error correction to the k bits.

21. A method for processing data in a non-volatile memory, comprising:

programming storage cells in the non-volatile memory, wherein each storage cell is programmed with information using a plurality of threshold voltage levels, and wherein each storage cell is programmed from bits from a plurality of pages;

organizing the storage cells in the non-volatile memory into storage cell groups, wherein each storage cell group stores m bits of information, wherein each of the storage cells in each of the storage cell groups is programmed with the plurality of threshold voltage levels;

selecting k bits from the pages to write for one storage cell group, wherein k<m, and wherein k and m are integer values greater than zero; and determining one threshold voltage level to use for each of the storage cells in the storage cell group to program the selected k bits in the storage cell group, wherein the selected k bits are programmed with threshold voltage levels defining one of a plurality of valid states, wherein the threshold voltage levels for at least one of the storage cells of the storage cell group in any two valid states differ by at least two threshold voltage levels.

22. The method of claim 21, wherein the threshold voltage levels for the storage cells in a storage cell group are configured to program a total number of states for a storage cell group including valid states in which the selected k bits are programmed and invalid states in which the selected k bits are not programmed.

23. The method of claim 22, wherein the threshold voltage levels for the storage cells in the storage cell group define the valid states and the invalid states such that the storage cells of the storage cell group programmed in any valid state experiencing leakage of one threshold voltage level transition to an invalid state.

24. The method of claim 22, wherein the valid states are one-half of the total number of states and configured such that the selected k bits programmed into the storage cells of the storage cell group in one of the valid states that experience leakage of one threshold voltage level transition to one of the invalid states.

25. The method of claim 22, further comprising:
reading threshold voltage levels for the storage cells in the storage cell group;
decoding the read threshold voltage levels to obtain decoded m bits;
determining whether the decoded m bits comprise one of the valid states;
translating the decoded m bits to k bits to return; and
marking the k bits as erroneous in response to determining that the decoded m bits do not comprise one of the valid states.

26. The method of claim 25, wherein the determining whether the decoded m bits comprise one of the valid states comprises:
performing a logical function on the decoded m bits, wherein a valid state is determined if a result of the logical function on the decoded m bits has a first value and wherein an invalid state is determined if the result of the logical function on the decoded m bits has a second value.

27. The method of claim 25, further comprising:
generating error correction information for the k bits,
wherein in response to determining that the decoded m bits comprise one of the invalid states, further comprising:
setting the k bits to a default error value; and providing information to an error correction unit on the k bits having one of the invalid states to provide error correction to the k bits.

* * * * *